United States Patent
Tsurumi et al.

(10) Patent No.: US 7,952,132 B2
(45) Date of Patent: May 31, 2011

(54) SEMICONDUCTOR MEMORY DEVICE INCLUDING A STACKED GATE HAVING A CHARGE STORAGE LAYER AND A CONTROL GATE, AND METHOD OF MANUFACTURING THE SAME

(75) Inventors: Daisuke Tsurumi, Tokyo (JP); Mitsuhiro Noguchi, Yokohama (JP); Haruhiko Koyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/634,406

(22) Filed: Dec. 9, 2009

(65) Prior Publication Data

US 2010/0084703 A1  Apr. 8, 2010

Related U.S. Application Data

(62) Division of application No. 11/940,838, filed on Nov. 15, 2007, now Pat. No. 7,652,319.

(30) Foreign Application Priority Data

Nov. 17, 2006  (JP) .................................. 2006-311789

(51) Int. Cl.
   *H01L 29/788* (2006.01)
(52) U.S. Cl. ................. 257/315; 257/316; 257/E29.129
(58) Field of Classification Search .................. 257/315, 257/316, E29.129
   See application file for complete search history.

(56) References Cited

U.S. PATENT DOCUMENTS

| 7,154,779 B2 | 12/2006 | Mokhlesi et al. |
| 2005/0083744 A1 | 4/2005 | Arai et al. |
| 2006/0022243 A1 | 2/2006 | Hashidzume et al. |
| 2006/0102949 A1 | 5/2006 | Roohparvar |
| 2007/0063262 A1 | 3/2007 | Violette et al. |
| 2007/0290274 A1 | 12/2007 | Yaegashi |
| 2008/0157166 A1 | 7/2008 | Sim |
| 2008/0169497 A1 | 7/2008 | Iino et al. |

FOREIGN PATENT DOCUMENTS

| JP | 2001-015619 | 1/2001 |
| JP | 2004-165553 | 6/2004 |

OTHER PUBLICATIONS

Japanese Office Action (with translation) issued on Mar. 15, 2011, in counterpart Japanese Patent Application No. 2006-311789 (6 pages).

*Primary Examiner* — Phat X Cao
(74) *Attorney, Agent, or Firm* — Oblon, Spivak, McClelland, Maier & Neustadt, L.L.P.

(57) ABSTRACT

A semiconductor memory device includes a source region, a drain region, a channel region, a charge storage layer, and a control gate electrode. The source region and drain region are formed separately from each other in a surface of a semiconductor substrate. The channel region is formed in the semiconductor substrate and located between the source region and the drain region. The charge storage layer is formed on the channel region with a first insulating film interposed therebetween. The control gate electrode is formed on the charge storage layer with a second insulating film interposed therebetween. The control gate has an upper corner portion rounded with a radius of curvature of 5 nm or more.

8 Claims, 19 Drawing Sheets

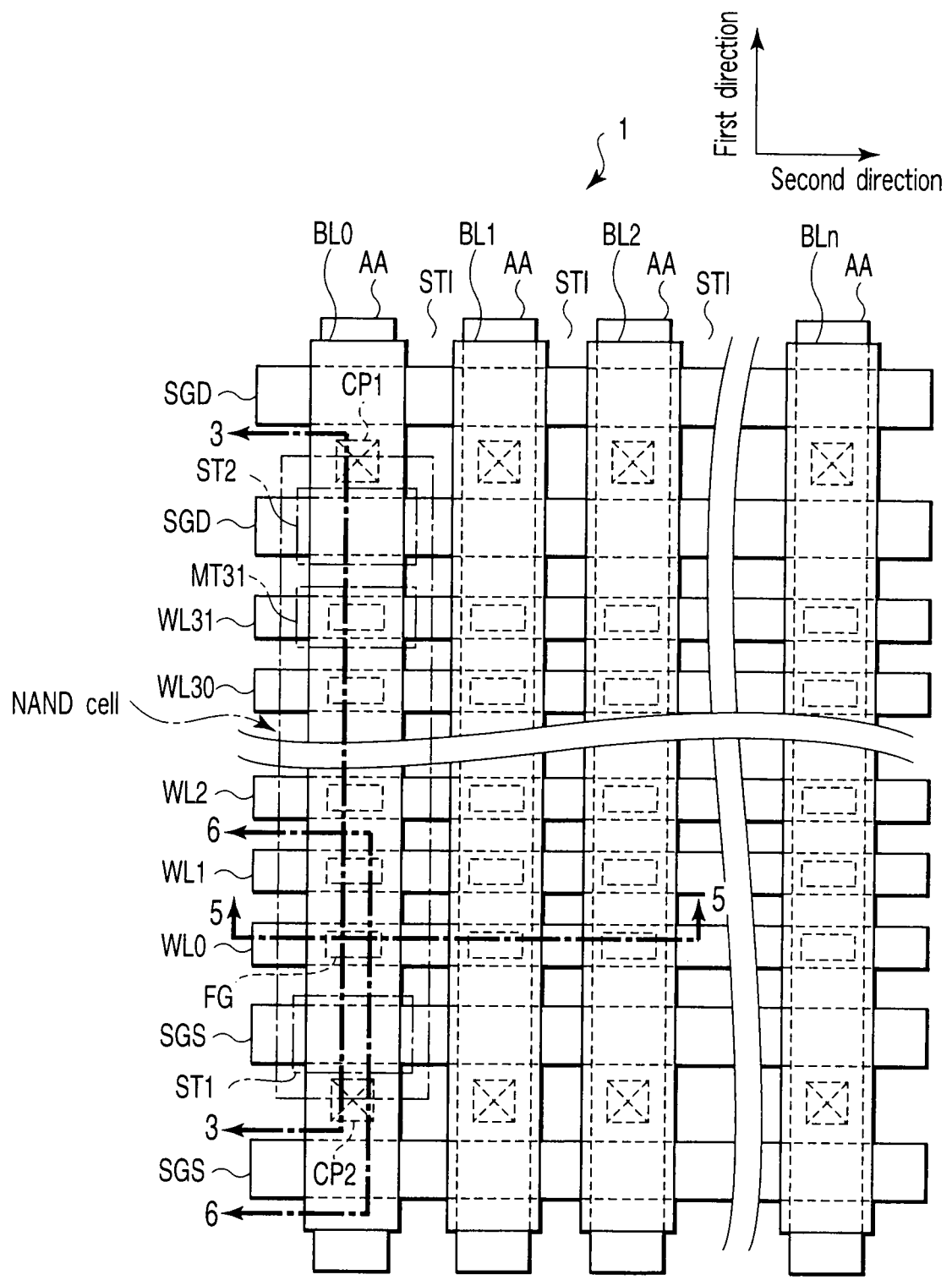
F I G. 2

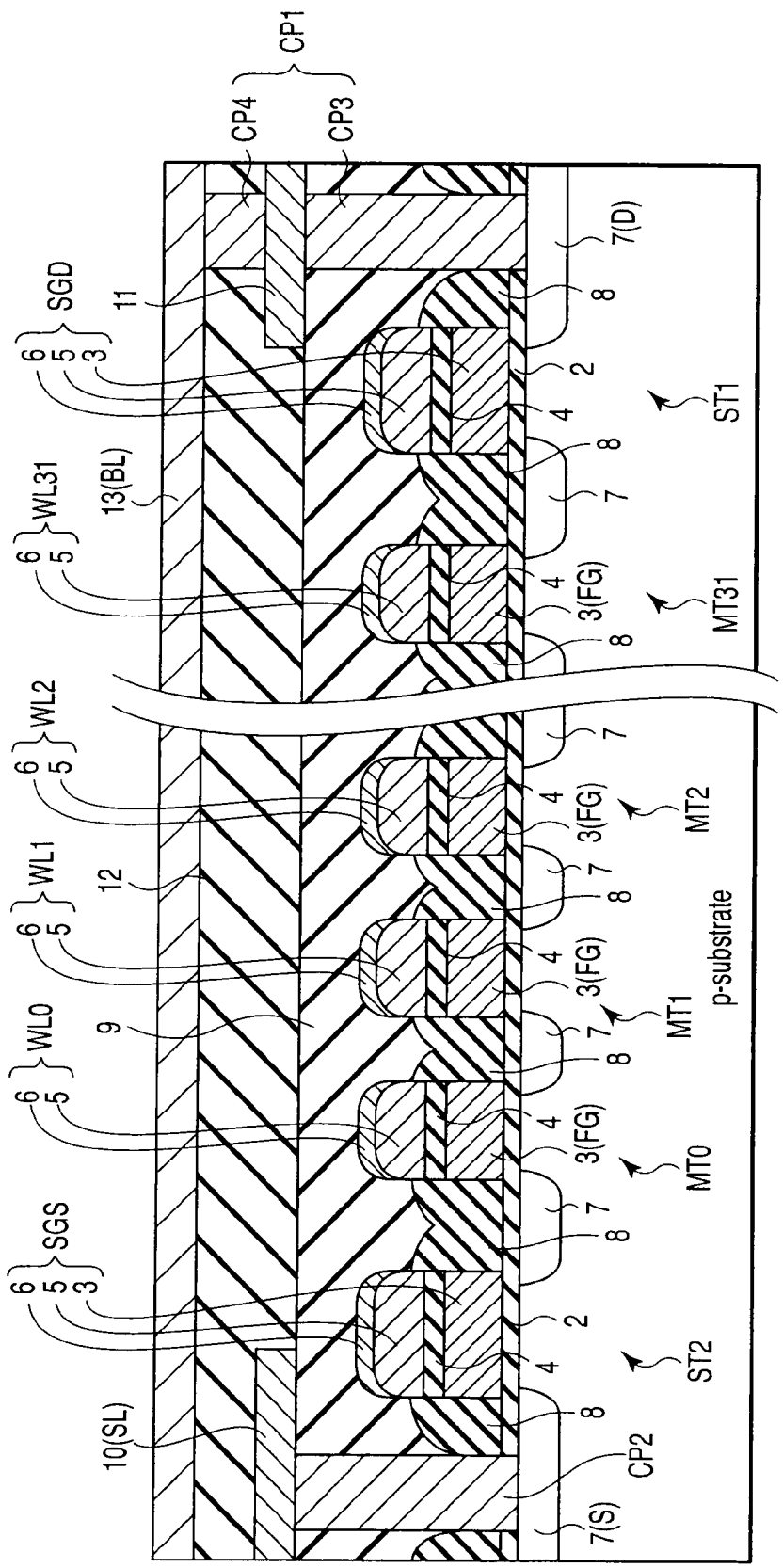
F I G. 3

$(L1-L3) \geq 2nm$

SEMICONDUCTOR MEMORY DEVICE INCLUDING A STACKED GATE HAVING A CHARGE STORAGE LAYER AND A CONTROL GATE, AND METHOD OF MANUFACTURING THE SAME

CROSS-REFERENCE TO RELATED APPLICATIONS

This application is a divisional of U.S. application Ser. No. 11/940,838, filed Nov. 15, 2007, and is based upon and claims the benefit of priority from prior Japanese Patent Application No. 2006-311789, filed Nov. 17, 2006, the entire contents of each of which are incorporated herein by reference.

BACKGROUND OF THE INVENTION

1. Field of the Invention

The present invention relates to a semiconductor memory device including a stacked gate having a charge storage layer and a control gate, and a method of manufacturing the same. For example, the present invention relates to the structure of a NAND flash memory.

2. Description of the Related Art

Conventionally, an electrically erasable and programmable read only memory (EEPROM) has been known as a non-volatile semiconductor memory. In the EEPROM, charges are injected to a charge storage layer from a channel region via a tunnel insulating film by a tunnel current. Data is read by measuring a change of electric conductivity of a MOS transistor (memory cell transistor) in accordance with an injected charge.

In a conventional EEPROM, the gate electrode of a memory cell transistor has the following structure. Specifically, a charge storage layer is formed on a semiconductor substrate with a tunnel insulating film interposed therebetween. A control gate electrode is formed on the charge storage layer with an inter-gate insulating film interposed therebetween. The control gate electrode has a multi-layer structure having the following layers in general. One is a semiconductor layer formed on the inter-gate insulating film, and another is a metal silicide layer formed on the semiconductor layer. The foregoing structure is disclosed in Jpn. Pat. Appln. KOKAI Publication No. 2005-116970, for example.

According to the conventional structure, the foregoing metal silicide layer is deposited on the entire surface, and thereafter, a silicon oxide film or silicon nitride film is deposited as a mask material. The mask material and the metal silicide layer are integrally processed (etched) via a lithography process and anisotropic reactive ion etching. Thus, the corner of the upper portion of the metal silicide contacting the boundary with an insulating film as the mask material becomes sharp. For this reason, according to the conventional EEPROM, if a potential difference occurs between control gate electrodes of neighboring memory cell transistors, an electric field concentrates at the corner of the control gate. In particular, when the data is written into the selected memory cell, a voltage of 15V or more and 30V or less is applied to a control gate line connected to the selected memory cell. Moreover, 0V is applied to the neighboring control gate line to prevent a write error. As a result, there is a possibility that a breakdown voltage fault occurs between control gate electrodes of neighboring memory cells.

BRIEF SUMMARY OF THE INVENTION

A semiconductor memory device according to an aspect of the present invention includes:

a source region and a drain region formed separately from each other in a surface of a semiconductor substrate;

a channel region formed in the semiconductor substrate and located between the source region and the drain region;

a charge storage layer formed on the channel region with a first insulating film interposed therebetween; and a control gate electrode formed on the charge storage layer with a second insulating film interposed therebetween, and having an upper corner portion rounded with a radius of curvature of 5 nm or more.

A method for fabricating a semiconductor memory device according to an aspect of the present invention includes:

forming a plurality of stacked gates on a semiconductor substrate separating from each other, each of the stacked gates including a first conductive layer formed on the semiconductor substrate with a first insulating film interposed therebetween, a second conductive layer formed on the first conductive layer with a second insulating film interposed therebetween and a mask material formed on the second conductive layer;

forming an impurity diffusion layer in a surface of the semiconductor substrate positioned between neighboring stacked gates;

forming a third insulating film on a sidewall of the stacked gates to fill between neighboring stacked gates with the third insulating film;

forming a fourth insulating film on the third insulating film and the stacked gates;

polishing the fourth insulating film using the mask material as a stopper to expose a surface of the mask material;

etching the mask material to remove the mask material on the second conductive layer so that the upper surface of the third insulating film is made lower than an upper surface of the second conductive layer;

after the etching the mask material, etching the surface of the second conductive layer so that an upper corner portion of the second conductive layer is rounded; and forming a metal silicide layer on the surface of the second conductive layer.

BRIEF DESCRIPTION OF THE SEVERAL VIEWS OF THE DRAWING

FIG. 2 is a top plan view showing a memory cell array included in a flash memory according to a first embodiment of the invention;

FIG. 3 is a cross-sectional view showing a memory cell array included in a flash memory according to a first embodiment of the invention, and a cross-sectional view taken along the line 3-3 shown in FIG. 2;

DETAILED DESCRIPTION OF THE INVENTION

First Embodiment

Figure 1:
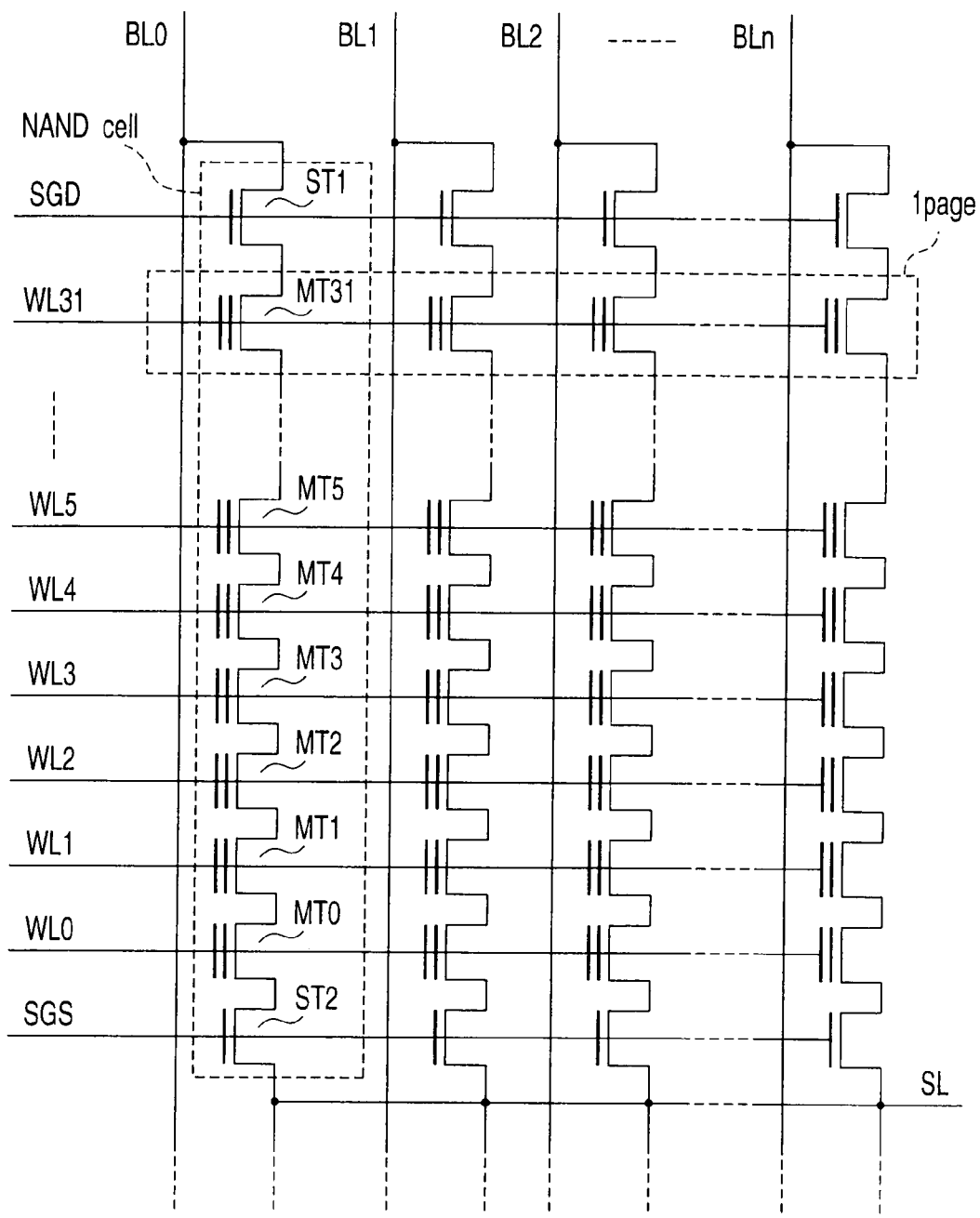
FIG. 1 is a circuit diagram of a memory cell array included in a flash memory according to a first embodiment of the invention.

A semiconductor memory device according to a first embodiment of the present invention and a method of manufacturing the same will be hereinafter described with reference to FIG. 1. FIG. 1 is a circuit diagram showing part of a memory cell array included in a NAND type flash memory according to this embodiment.

As shown in FIG. 1, a memory cell array has a plurality of NAND cells. In FIG. 1, one row of a NAND cell only is shown. Each NAND cell includes 32 memory cell transistors MT0 to MT31, and select transistors ST1 and ST2. In the following description, the memory cell transistors MT0 to MT31 are simply called memory cell transistor MT, for simplification of explanation. The memory cell transistor has a stacked gate structure including a charge storage layer (e.g., floating gate) and a control gate electrode. The charge storage layer is formed on a semiconductor substrate with a gate insulating film interposed therebetween. The control gate electrode is formed on the floating gate with an inter-gate insulating film interposed therebetween. The number of the memory cell transistors is not limited to 32; in this case, 8, 16, 64, 128 and 256 may be given. Thus, the number of the memory cell transistors is not limited so long as it is plural. Neighboring memory cell transistors MT mutually share a source and drain. The memory cell transistors are arranged so that the current path is connected in series between select transistors ST1 and ST2. A drain region of one terminal of the serial-connected memory cell transistors MT is connected to a source region of the select transistor ST1. A source region of the other terminal is connected to a drain region of the select transistor ST2.

Control gate electrodes of the memory cell transistors existing in the same row are connected to any of word lines WL0 to WL31 in common. Gates of the select transistors ST1 and ST2 existing in the same row are respectively connected to select gate lines SGD and SGS in common. In the memory cell array, drains of the select transistors existing in the same column are connected to any of bit lines BL0 to BLn (n: natural number) in common. For simplification of explanation, word lines WL0 to WL31 and bit lines BL0 to BLn are simply called word line WL and bit line BL. The source of the select transistor ST2 is connected to a source line SL in common. Both select transistors ST1 and ST2 are not always necessary, but any one only of two select transistors may be provided so long as the NAND cell is selectable.

In FIG. 1, one row NAND cell only is illustrated, but a plurality of row NAND cells are arrayed in the memory cell array. NAND cells existing in the same column are connected to the same bit line BL. Data is collectively written to the memory cell transistors MT connected to the same word line WL. This unit is called one page. Data is collectively erased in a plurality of NAND cells, and this unit is called a block.

The planer structure of the memory cell array having the foregoing configuration will be hereinafter described with reference to FIG. 2. FIG. 2 is a top plan view showing a memory cell array.

As shown in the FIG. 2, plural striped element areas AA extending along a first direction are formed in a p-type semiconductor substrate 1 along a second direction orthogonal to the first direction. An isolation region STI is formed between neighboring element areas AA. The element area AA is electrically isolated via the isolation region STI. On the semiconductor substrate 1, the word lines WL and select gate lines SGD and SGS configured as stripes along the second direction are formed so as to span the plurality of element regions AA. An area where the word line WL and the element area AA cross is provided with a floating gate FG. The area where the word line WL and the element area AA cross is provided with a memory cell transistor MT. An area where select gate lines SGD and SGS and the element area AA cross is respectively provided with select transistors ST1 and ST2. An impurity diffusion layer functioning as a source or drain of the memory cell transistor MT and select transistors ST1 and ST2 is formed in the element area AA between word lines, between select gate lines and between the word line and the select gate line.

The impurity diffusion layer formed in the element area AA between neighboring select gate lines SGD in the first direction functions as a drain region of the select transistor ST1. A contact plug CP1 is formed on the drain region. The contact plug CP1 is connected to a stripe-shaped bit line BL provided along the first direction. The impurity diffusion layer formed in the element area AA between neighboring select gate lines SGS in the first direction functions as a source region of the select transistor ST2. A contact plug CP2 is formed on the source region. The contact plug CP2 is connected to a source line (not shown).

The sectional structure of the NAND cell having the foregoing configuration will be hereinafter described with reference to FIG. 3. FIG. 3 is a cross-sectional view taken along the bit line direction of the NAND cell, and cross-sectional view along the line 3-3 of FIG. 2.

As depicted in FIG. 3, a gate insulating film 2 is formed on a p-type semiconductor substrate 1. Each gate electrode of memory cell transistors MT, select transistors ST1 and ST2 is formed on the gate insulating film 2. The gate electrode of memory cell transistors MT, and select transistors ST1 and ST2 includes a polycrystalline silicon layer 3 formed on the gate insulating film 2, an inter-gate insulating film 4 formed on the polycrystalline silicon layer 3, a polycrystalline silicon layer 5 formed on the inter-gate insulating film 4, and a metal silicide layer 6 formed on the polycrystalline silicon layer 5. The inter-gate insulating film 4 is formed of a silicon oxide film or ON film, NO film or ONO film having a stacked structure of a silicon oxide film and a silicon nitride film, or a stacked structure containing those. Or, the inter-gate insulating film 4 is formed of a stacked structure of $TiO_2$, $HfO_2$, $Al_2O_3$, $HfAl_x$, HfAlSi film and a silicon oxide film or a silicon nitride film.

In the memory cell transistor MT, the polycrystalline silicon layer 3 functions as a floating gate (FG). On the other hand, the polycrystalline silicon layer 5 and the silicide layer 6 are connected adjacent to each other in a direction perpendicular to the bit line, and further, function as a control gate electrode (word line WL).

In the select transistors ST1 and ST2, polycrystalline silicon layers 3, 5 and silicide layer 6 are connected adjacent to each other in the word line direction. As an alternative, a polycrystalline silicon layer 3 is separated to each other in the word line direction, and is connected to the polycrystalline silicon layer 5 with an opening of the inter-gate insulating film 4 at the select transistors, respectively. These polycrystalline silicon layers 3, 5 and silicide layer 6 function as select gate lines SGS and SGD. Incidentally, the polycrystalline silicon layer 3 only may function as the select gate line. In this case, the polycrystalline silicon layer 5 and the silicide layer 6 of the select transistors ST1 and ST2 are set to a constant potential or a floating state.

The inner surface of the semiconductor substrate 1 positioned between gate electrodes is formed with an $n^+$ type impurity diffusion layer 7. The impurity diffusion layer 7 is shared between neighboring transistors, and functions as source (S) and drain (D). An area between neighboring source and drain functions as a channel area where electrons move. The gate electrode, impurity diffusion layer 7 and channel area are provided, and thereby, MOS transistors functioning as the memory cell transistor MT, and the select transistors ST1 and ST2 are formed.

A sidewall insulating film 8 is formed on a sidewall of the gate electrode. The sidewall insulating film 8 is filled between gate electrodes of neighboring memory cell transistors MT and between gate electrodes of the select transistors ST1 and ST2. An interlayer insulating film 9 is formed on the semiconductor substrate 1 to cover the foregoing memory cell transistors MT, and select transistors ST1 and ST2. In the interlayer insulating film 9, a contact plug CP2 connected to the impurity diffusion layer (source) 7 of the source-side select transistor ST2 is formed. A metal interconnect layer 10 connected to the contact plug CP1 is formed on the interlayer insulating film 9. The metal interconnect layer 10 functions as a source line SL. Moreover, in the interlayer insulating film 9, a contact plug CP3 connected to the impurity diffusion layer (drain) 7 of the drain-side select transistor ST1 is formed. A metal interconnect layer 11 connected to the contact plug CP3 is formed on the interlayer insulating film 9.

An interlayer insulating film 12 is formed on the interlayer insulating film 9 to cover metal interconnect layers 10 and 11. In the interlayer insulating film 12, a contact plug CP4 connected to the metal interconnect layer 11 is formed. A metal interconnect layer 13 connected to a plurality of contact plugs CP4 in common is formed on the interlayer insulating film 12. The metal interconnect layer 13 functions as the bit line BL. Contact plugs CP3 and CP4 are equivalent to the contact plug CP1 in FIG. 2.

Figure 4:
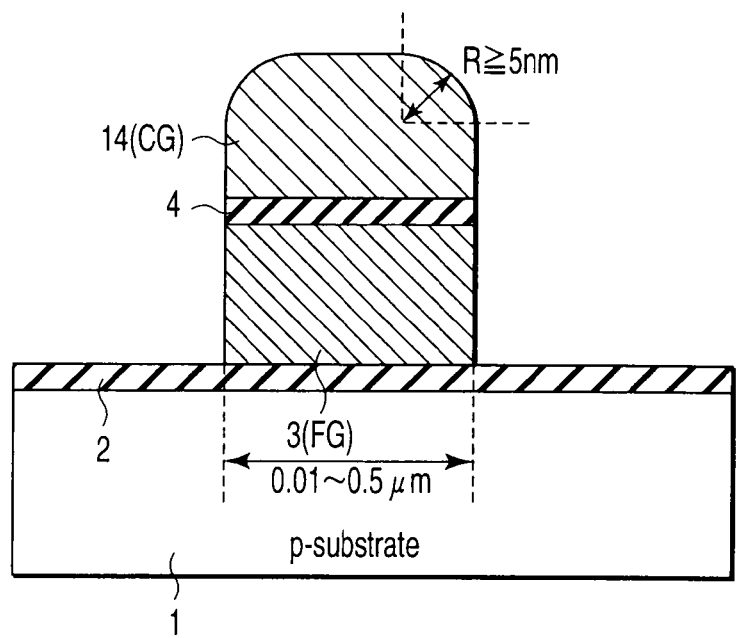
FIG. 4 is an enlarged view showing the sectional structure of a gate electrode included in the memory cell transistor shown in FIG. 3.

FIG. 4 is an enlarged view showing a gate electrode of the memory cell transistor shown in FIG. 3. In FIG. 4, the polycrystalline silicon layer 5 and the metal silicide layer 6 are collectively shown as a control gate electrode 14. Illustration of the impurity diffusion layer 7 and the sidewall insulating film 8 is omitted.

As shown in FIG. 4, the control gate electrode (CG) 14 has a rounded upper edge portion. The radius of curvature R of this roundness is set to at least 5 nm or more and 30 nm or less. For example, the radius of curvature is 10 nm optimally. The radius of curvature will be hereinafter described. For example, the minimum interval x of the control gate electrode 14 of the neighboring memory cell transistors is 70 nm or less. The voltage applied to the word line (control gate electrode) of the memory cell transistor making a write operation is 21V or more. An electric field of 3 MV/cm or more is applied between neighboring control gate electrodes 14 in an area where the sidewalls are mutually parallel, and not rounded. In this case, low breakdown voltage of the insulating film 8 or an insulating film 30 leads to trouble. If the insulating films 8 and 30 are a deposited silicon oxide film, the following matter has been known. Specifically, even if the quality of the oxide film is preferable, an electric field stress of 10 MV/cm and less than or equal to 1000 seconds is applied, and thereby, dielectric breakdown occurs. In this case, the field concentration at a portion where a silicide electrode contacts metal increases. More specifically, the field concentration increases by about $1/[(2R/x) \times \log\{1+(x/2R)\}]$ times as compared with a facing electrode having the minimum interval x. Thus, R>5 nm is given, and thereby, the filled concentration is reduced to 3.4 times, that is 10 MV/cm or less. Therefore, as described above, the radius of curvature is preferably set to at least 5 nm or more to secure the dielectric breakdown voltage of the insulating film 30.

The outer wall of the control gate electrode 14 has the foregoing rounded shape. Specifically, as shown in FIG. 3, the upper edge portion of the polycrystalline silicon (hereinafter, referred to simply as polysilicon) layer 5 is formed round in this embodiment. In this case, it is sufficient so long as the metal silicide layer 6 is formed into a rounded shape. There is no need of forming the upper corner of the polycrystalline silicon layer 5 into a rounded shape. Although FIG. 4 shows the case of the memory cell transistor MT, select transistors ST1 and ST2 each have the gate electrode having the same structure as above. The width (length arranged in the order of source, channel and drain) of the gate electrode of the memory cell transistor MT is 0.01 μm or more and 0.5 μm or less.

Figure 5:
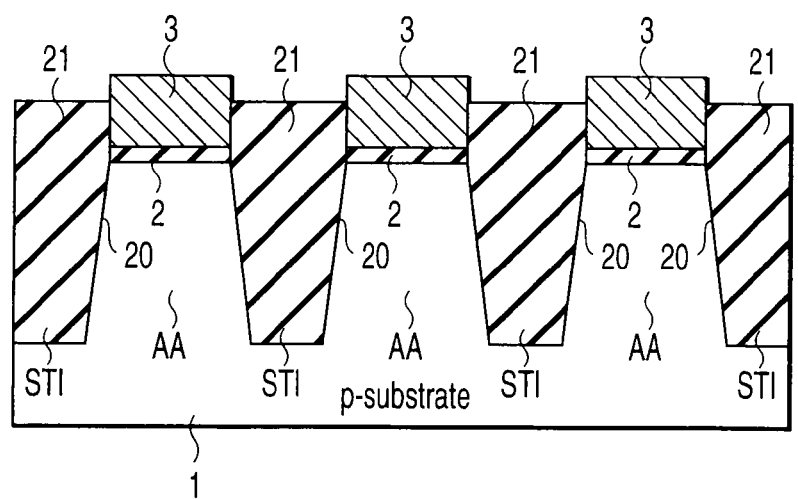
FIGS. 5 to 15 are cross-sectional views showing first to 11-th manufacturing processes of the flash memory according to the first embodiment of the invention.

The method of manufacturing the NAND cell of a NAND type flash memory having the foregoing structure will be hereinafter described with reference to FIG. 5 to FIG. 15. FIGS. 5 to 15 are cross-sectional views successively showing the process of manufacturing the NAND cell according to this embodiment. FIG. 5 is a cross sectional view taken along the line 5-5 of FIG. 2. FIGS. 6 to 15 are cross sectional views taken along the line 6-6 of FIG. 2.

As shown in FIG. 5, a gate insulating film (tunnel gate insulating film) 2 is formed on a p-type silicon substrate 1.

The gate insulating film 2 is formed using the following materials, for example, a silicon oxide film, oxynitride film (silicon oxide and nitride film) or silicon nitride film, and its film thickness is about 4 to 20 nm. For example, boron or indium is implanted as an impurity into the silicon substrate 1, and the concentration is about $10^{14}$ cm$^{-3}$ to $10^{19}$ cm$^{-3}$.

A polysilicon layer 3 is formed on the gate insulating film to have a thickness of about 10 nm to 500 nm using low pressure chemical vapor deposition (LPCVD). The polysilicon layer 3 functions as a floating gate in the memory cell transistor MT.

After the polysilicon layer 3 is deposited, the foregoing polysilicon 3, gate insulating film 2 and silicon substrate 1 are etched using a photolithography technique and anisotropic etching such as reactive ion etching (RIE) to make a trench 20. The trench 20 is used for forming an isolation area, and has a depth of 0.05 μm to 0.5 μm, for example. Thereafter, the trench 20 is filled with an insulating film 21, and thereby, an isolation area STI is formed. Via the foregoing process, the structure shown in FIG. 5 is obtained.

Figure 6:
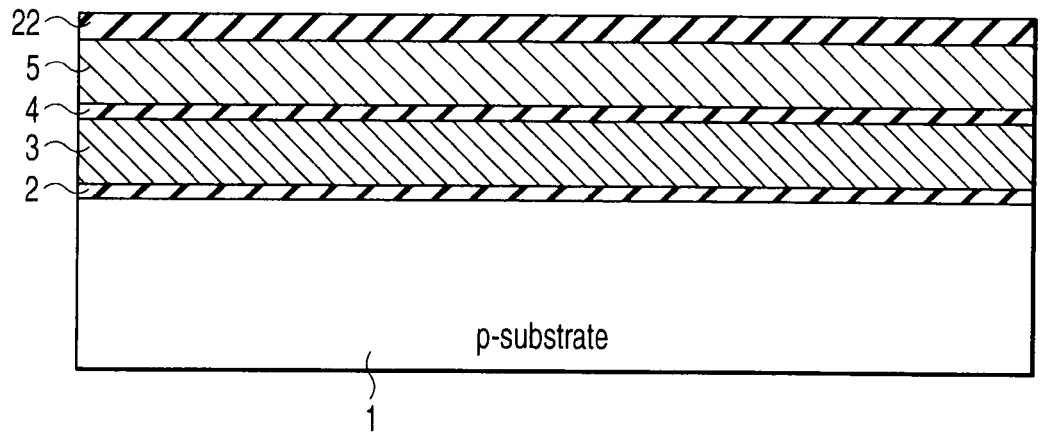

As illustrated in FIG. 6, an inter-gate insulating film 4 is formed on the polysilicon layer 3 and the isolation area STI. For example, the inter-gate insulating film 4 is formed of a single-layer silicon nitride film, a silicon oxide film or a stacked structure containing those. Or, the inter-gate insulating film 4 is formed of a stacked layer of at least one of TiO$_2$, HfO$_2$, Al$_2$O$_3$, HfAlO$_x$, HfAlSi and HfSi films and a silicon oxide film or a silicon nitride film. The inter-gate insulating film 4 is formed having a thickness of 5 nm to 30 nm, for example.

A polysilicon layer 5 is further formed on the inter-gate insulating film 4 having a thickness of 10 nm to 500 nm. The polysilicon layer 5 functions as a control gate electrode in the memory cell transistor MT. Moreover, the polysilicon layer 5 functions as select gate lines SGD and SGS together with the polysilicon layer 3 in the select transistors ST1 and ST2.

A mask material 22 is further formed on the polysilicon layer 5 having a thickness of 10 nm to 500 nm. The mask material 22 is formed using a silicon nitride film, or a stacked insulating film of a silicon oxide film and a silicon nitride film. The mask material 22 is used as an etching mask for forming gate electrodes of the memory cell transistor MT, and select transistors ST1 and ST2.

Various other manufacturing methods for the select transistor ST1, ST2, the memory cell transistor MT and the isolation area STI may be used as well, including those described in United States Patent Application Publication 2007/0171720, the entire contents of this reference being incorporated herein by reference. Since the embodiment is related to the structure of the control gate, the advantageous effect is obtained using above method described in the reference.

Figure 7:
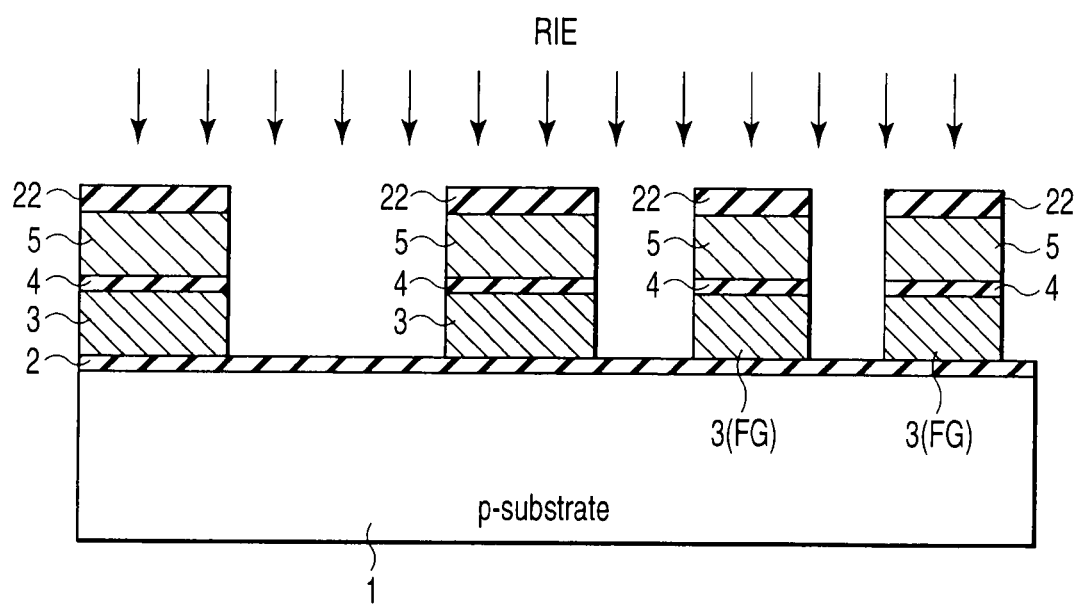

As depicted in FIG. 7, the foregoing mask material 22, polysilicon layers 5, 3 and inter-gate insulating film 4 are etched using a photolithography technique and RIE. As a result, part of each gate electrode of the memory cell transistor MT, and select transistors ST1 and ST2 is formed as shown in FIG. 7.

Figure 8:
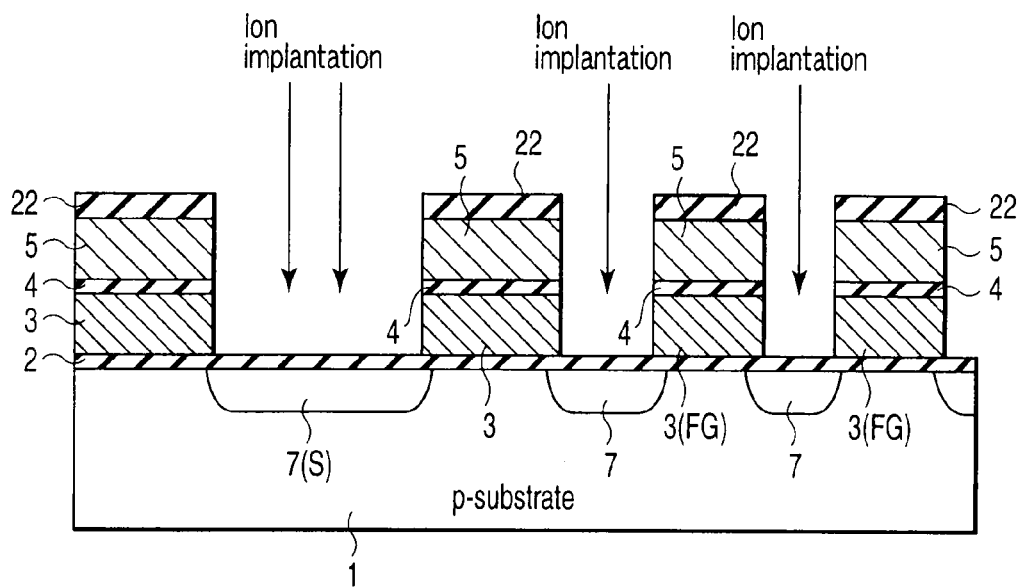

As seen from FIG. 8, for example, phosphorus, arsenic or antimony ions are implanted into the surface of the silicon substrate 1. In this case, polysilicon layers 3, 5 and mask material 22 function as an ion implantation mask. As a result, an n-type impurity diffusion layer 7 functioning as a source region and a drain region is formed in the surface of the silicon substrate 1. According to this ion implantation, the surface concentration of the impurity diffusion layer 7 is $10^{17}$ cm$^{-3}$ to $10^{21}$ cm$^{-3}$, for example. The depth is 10 nm to 500 nm.

Figure 9:
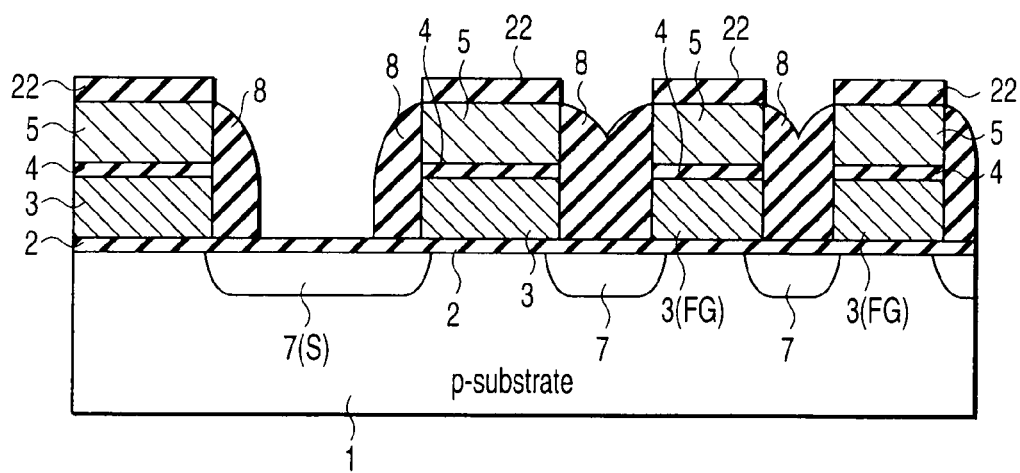

As shown in FIG. 9, an interlayer insulating film 8 is formed on the silicon substrate 1. The interlayer insulating film 8 is formed having a thickness of 50 to 400 nm, for example. The interlayer insulating film 8 is filled between gate electrodes of neighboring memory cell transistors MT and between gate electrodes of the neighboring memory cell transistor MT and select transistors ST1 and ST2. The following materials are used as the interlayer insulating film 8. For example, TEOS (tetraethyleorthosilicate), HTO (high temperature oxide), ALD (atomic layer deposition)-SiO$_2$, BSG (boron silicate glass), PSG (phosphorous silicate glass), BPSG (boron phosphorous silicate glass) and a silicon oxide film using HDP (high density plasma), a silicon nitride film or a stacked structure of the silicon oxide film and the silicon nitride film are given. Part of the interlayer insulating film 8 is etched using RIE, and thereby, the interlayer insulating film 8 is left on a sidewall only of the gate electrode and part of the gate insulating film 2 between neighboring select transistors is exposed.

Figure 10:
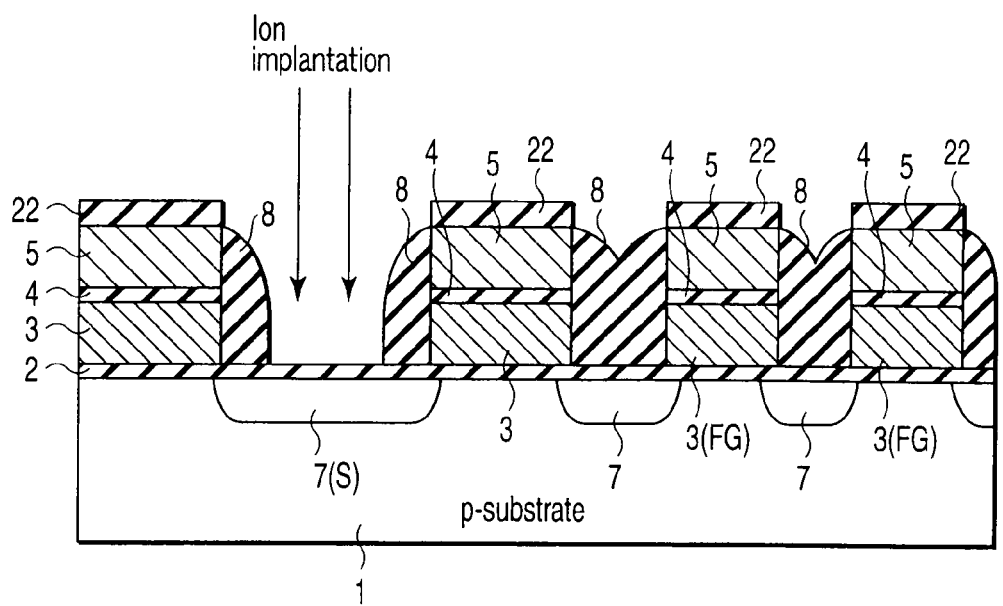

As illustrated in FIG. 10, phosphorous, arsenic or antimony is implanted into the silicon substrate 1 between neighboring select transistors using ion implantation. In this way, the drain region of the select transistor ST1 and the source region of the select transistor ST2 may come to have a low resistance.

Figure 11:
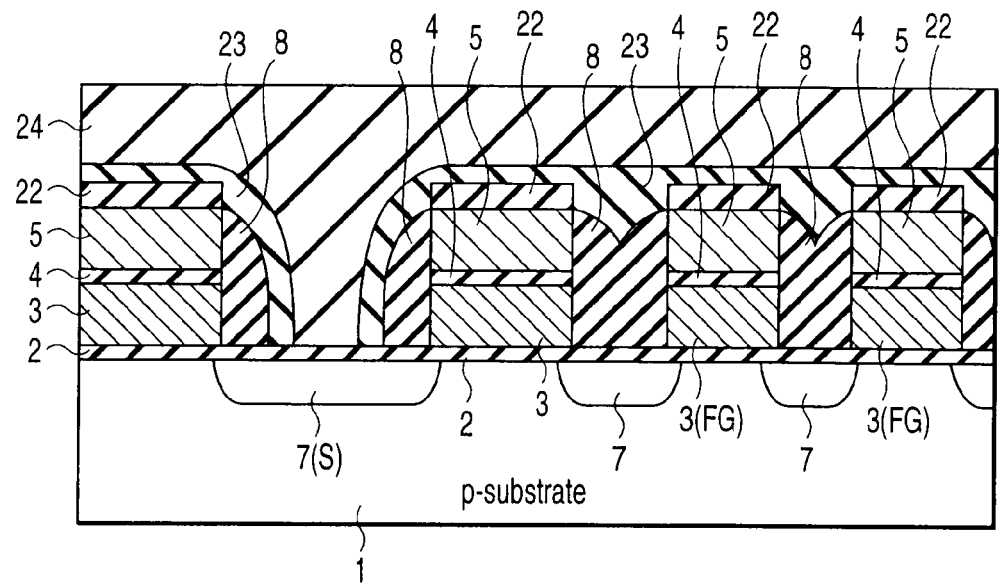

As depicted in FIG. 11, an insulating film 23 is formed on the silicon substrate 1 to have a thickness of 50 nm using a LPCVD process. For example, the insulating film 23 is formed using a silicon oxide film, silicon nitride film or silicon oxy-nitride film. Then, an interlayer insulating film 24 is formed on the entire surface having a thickness of 500 nm to 1000 nm, for example. The interlayer insulating film 24 is formed of TEOS, HTO, BSG, PSG, BPSG, or a silicon oxide film formed using HDP or a silicon nitride film.

Figure 12:
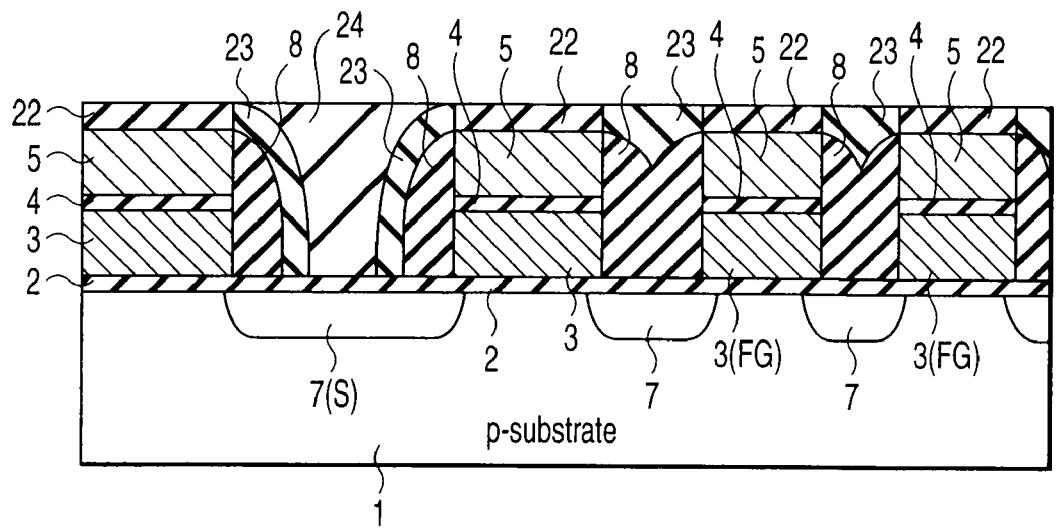

Thereafter, as seen from FIG. 12, the interlayer insulating film and the insulating film 23 are polished and planarized by chemical mechanical polishing (CMP) using the mask material as a stopper. As a result, the upper surface of the mask material 22 is exposed as seen from FIG. 12.

Figure 13:
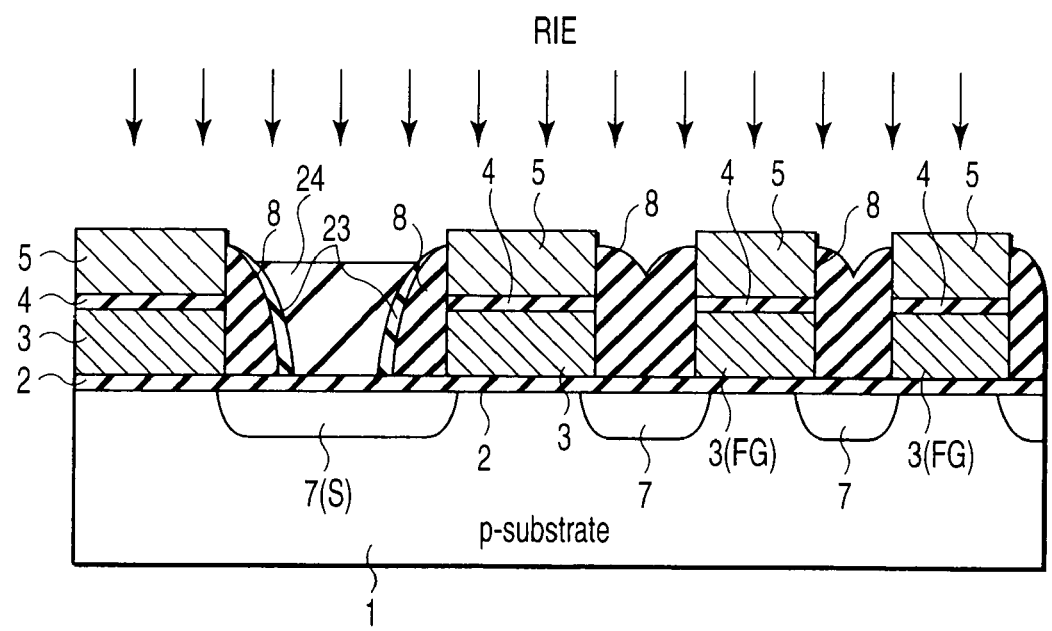

As shown in FIG. 13, the mask material and the insulating film 23 are etched and removed via reactive ion etching (RIE) using fluorine etching gas. In this case, the upper surface of the sidewall insulating film is positioned lower than that of the polysilicon layer 3. This is because an area for forming the silicide layer in the after-process is increased, and thereby, the resistance of the word line (control gate electrode) functioning as a data control line is reduced. This process may be carried out in the following manner. For example, in the process described in FIG. 9, the height of the sidewall insulating film 8 is previously formed lower than the upper surface of the polysilicon layer 5 by etch-back. Or, in the process of FIG. 13, part of the upper surface of the sidewall insulating film 8 may be simultaneously etched.

Figure 14:
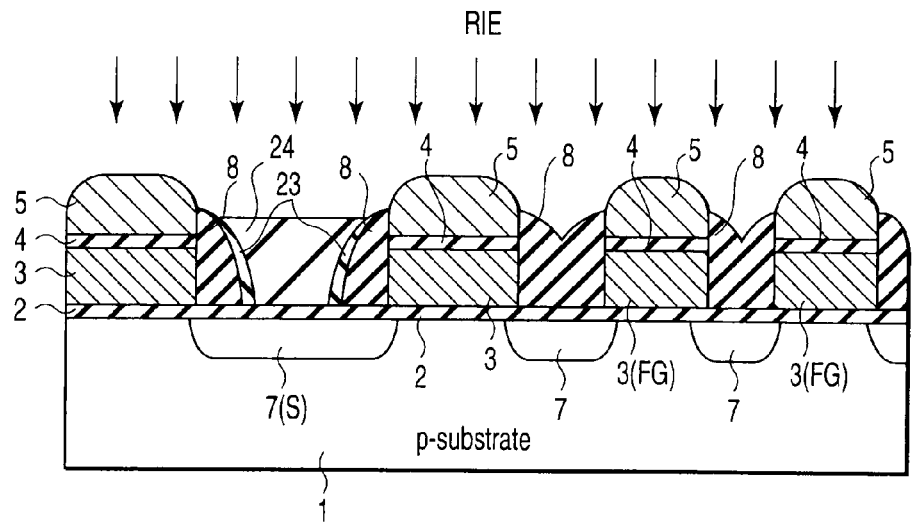

In the shown in FIG. 13, part of the upper surface of the polysilicon layer 5 is etched without stopping etching when the mask material 22 is removed. In this case, isotropic etching is used, and thereby, a corner portion of the exposed upper surface and side of the polysilicon layer 5 is easy to be etched as compared with a planer potion. As a result, as depicted in FIG. 14, the corner portion of the polysilicon layer 5 is further etched as compared with the upper surface thereof. Therefore, the corner portion of the polysilicon layer 5 is formed into a rounded shape. The foregoing etching is carried out so that the radius of curvature of the roundness is set to 5 nm or more and less than or equal to 30 nm, preferably, about 10 nm. The magnitude of the radius of curvature is controllable depending on the etching time. Etching of the polysilicon layer 5 may be carried out in the same process of etching the mask material 22 and the insulating film 8, or may be carried out in an independent process.

A metal layer such as titanium, cobalt and nickel is deposited on the polysilicon layer 5 to have a thickness of 10 nm to 100 nm using sputtering. Thereafter, a heat treatment is carried out to obtain a metal silicide of the deposited metal and part of the polysilicon layer 5. As a result, a metal silicide layer 6 is formed as seen from FIG. 15. The front-end of the metal layer, that is, the corner portion of the polysilicon layer 5 is rounded. Therefore, a corner portion of the metal silicide layer has a rounded shape like the polysilicon layer 5. Thereafter, non-reactive metal layers are etched and removed using a mixed liquid of sulfuric acid and hydrogen peroxide water. Incidentally, the metal silicide layer 6 may be a titanium silicide film, cobalt silicide film or nickel silicide film. Moreover, the metal silicide layer 6 may be formed of a metal silicide film containing two or more of titanium, cobalt and nickel.

Via the foregoing process, a stacked gate including polysilicon layers 3, 5 and metal silicide layer 6 is completed. The memory cell transistor MT, select transistors ST1 and ST2 are formed by the stacked gate and the impurity diffusion layer 7.

Thereafter, an interlayer insulating film 9 is deposited on the entire surface to form contact plugs CP2 and CP3. Metal interconnect layers 10 an 11 connected respectively to contact plugs CP2 and CP3 are further formed on the interlayer insulating film 9. The metal interconnect layer 10 functions as a source line. Then, an interlayer insulating film 12 is deposited on the interlayer insulating film 9 to cover the metal interconnect layers 10 and 11. A contact plug CP4 connected to the metal interconnect layer 11 is formed in the interlayer insulating film 12. A metal interconnect layer 13 connected to the contact plug CP4 and functioning as a bit line is formed on the interlayer insulating film 12. In this way, the structure shown in FIG. 3 is obtained.

The following effect (1) is obtained in a semiconductor memory device according to this embodiment and the manufacturing method.

(1) Concentration of electric field is prevented, and it is possible to improve the reliability of a semiconductor memory device.

Figure 16:
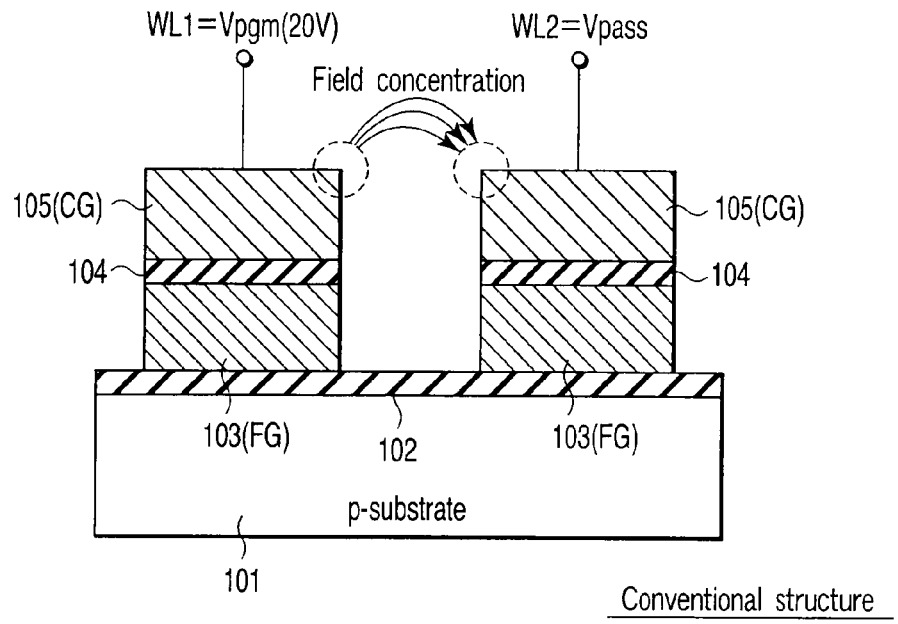
FIG. 16 is a cross-sectional view showing a gate electrode included in a conventional memory cell transistor.
Figure 17:
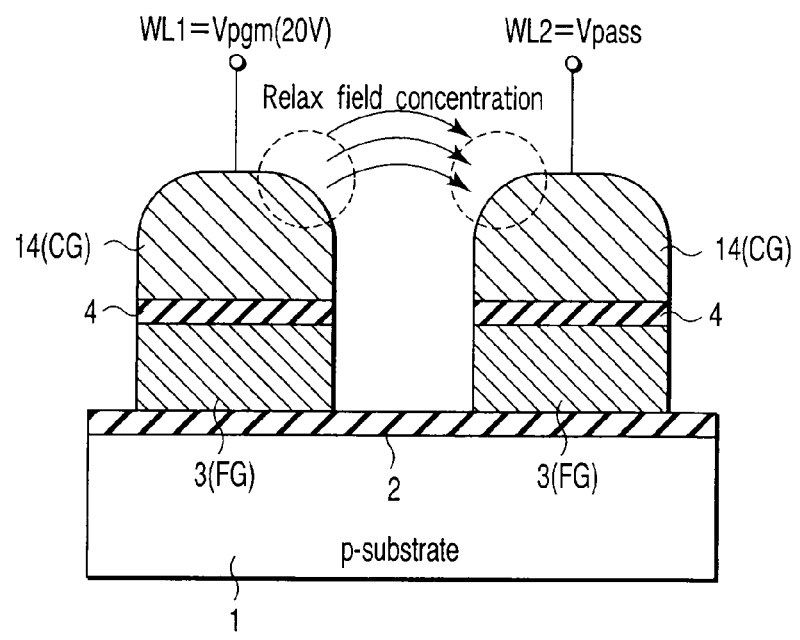
FIG. 17 is a cross-sectional view showing a gate electrode included in a memory cell transistor according to a first embodiment of the invention.

The foregoing effect will be explained in detail with reference to FIG. 16 and FIG. 17. FIG. 16 and FIG. 17 are cross-sectional views of each memory cell transistor MT of NAND type flash memories according to the conventional art and this embodiment, and in particular, show a stacked gate structure.

As shown in FIG. 16, according to the conventional structure, a control gate electrode 105 is formed on a floating gate 103 with an inter-gate insulating film 104 interposed therebetween. Data write is made in the order of the memory cell transistor near to a select gate line SGS. For example, FIG. 16 shows the case where data is written to the memory cell transistor MT1 connected to a word line WL1. In this case, a voltage Vpgm of about 20V is applied as a write voltage to the word line WL1. On the contrary, a voltage Vpass from about 8V to 13V for turning on the memory cell transistor MT2 is applied to a word line WL2 on the side of the select gate line SGD from the word line WL1. Usually, a relation of Vpgm>>Vpass is given. Thus, a potential difference occurs between word lines WL1 and WL2. As a result, according to the conventional structure, an electric field is concentrated on the corner portion of the control gate electrode. This is a factor of causing a problem that the dielectric breakdown voltage between word lines WL1 and WL2 is reduced.

Although no illustration is made, voltage V1 from 0V to 3V for turning off the memory cell transistor MT0 is applied to a word line WL0 on the side of the select gate line SGS from the word line WL1. Thus, a potential difference occurs between word lines WL1 and WL0; as a result, an electric field concentrates on the corner portion of the control gate electrode. This is a factor of causing a problem that the dielectric breakdown voltage between word lines WL1 and WL0 is reduced. This problem is particularly pronounced in the following NAND type memory cell. Specifically, in the NAND type memory cell, a current terminal is connected, no contact area is given between neighboring memory cells, and further, the potential difference between word lines is applied to the insulating film 9 or 8.

On the contrary, according to the structure of this embodiment, the upper corner portion of the control gate electrode 14 is rounded as seen from FIG. 17. Thus, even if a large potential difference (Vpgm−Vpass) is applied between word lines WL1 and WL2, the field concentration is relaxed. Therefore, it is possible to prevent the dielectric breakdown voltage between control gate electrodes from being reduced. Further, the reliability of a NAND type flash memory is improved, and the yield can be enhanced. The process of rounding the control gate electrode is carried out at the same time as the etching process of the insulating films 22 and 23, as described in FIG. 13 and FIG. 14. Therefore, the foregoing effect is obtained without adding a new process in particular.

In FIG. 17, although the case of the effect between word lines is described, the same effect is obtained between the word line and the select gate line. Specifically, according to the structure of this embodiment, the corner portion of the metal silicide layer 6 functioning as the select gate line is rounded with a radius of curvature of 5 nm or more and 30 nm or less. Therefore, it is possible to prevent a reduction in dielectric breakdown voltage between the neighboring select gate line and word line. However, if the following product is given, there is no need of rounding the select gate line, and the structure of this embodiment is employed in the word line only. The product has the following structure that the interval between the select gate line and the word line is wider than that between word lines, and thus, a reduction in the dielectric breakdown voltage is not caused.

Second Embodiment

Figure 18:
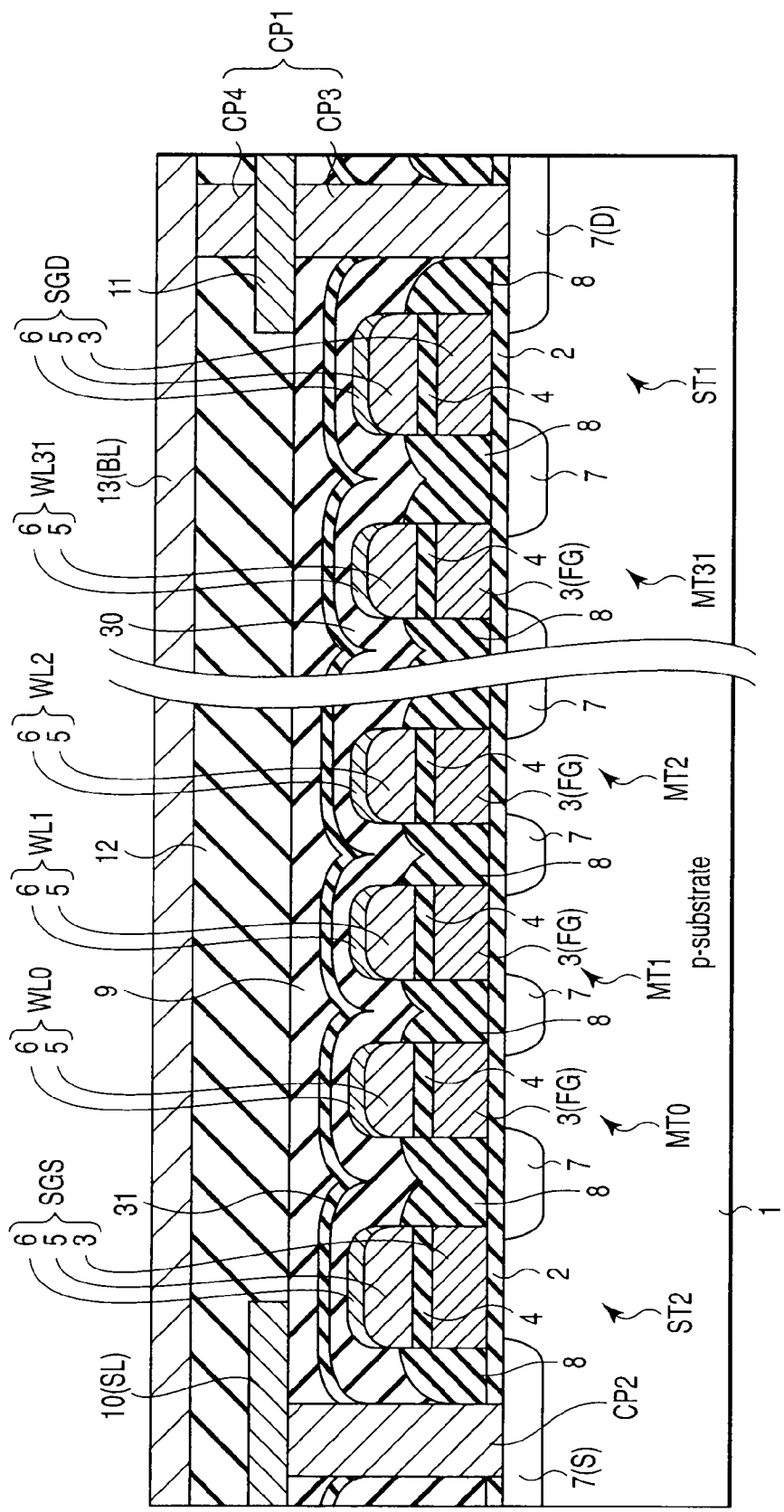
FIG. 18 is a cross-sectional view showing a memory cell array included in a flash memory according to a second embodiment of the invention, and a cross-sectional view taken along the line 3-3 shown in FIG. 2.

A semiconductor memory device according to a second embodiment of the present invention and a method of manufacturing the same will be hereinafter described. This second embodiment relates to an insulating film between gate electrodes in the structure described in the foregoing first embodiment. FIG. 18 is a cross-sectional view taken along the bit line direction of a NAND cell according to the second embodiment. FIG. 18 is equivalent to a cross-sectional view in the direction along the line 3-3 of FIG. 2.

As shown in FIG. 18, in the NAND cell according to the second embodiment, a silicon oxide film ($SiO_2$ film) is used as the material for a sidewall insulating film 8 in the structure described in the first embodiment. A silicon oxide film ($SiO_2$ film) 30 is formed on the stacked gate structure including polysilicon layers 3, 5 and silicide layer 6 and the sidewall insulating film 8. The sidewall insulating film 8 and the silicon oxide film 30 are buried between neighboring stacked gate structures. A silicon nitride film (SiN film) 31 is further formed on the silicon oxide film 30. An interlayer insulating film 8 is formed on the silicon nitride film 31. The other structures are the same as those of the first embodiment.

Figure 19:
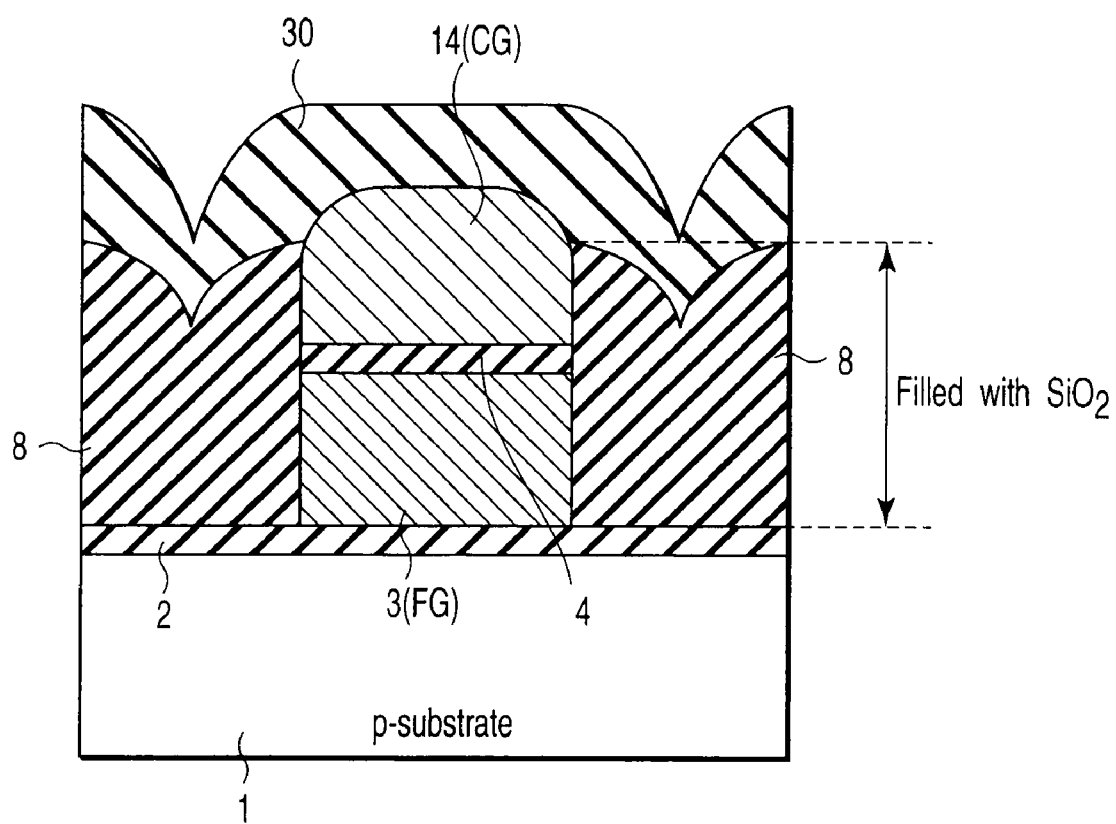
FIG. 19 is an enlarged view showing the sectional structure of a gate electrode included in the memory cell transistor shown in FIG. 18.

FIG. 19 is an enlarged view showing a gate electrode of the memory cell transistor shown in FIG. 18. In FIG. 19, the polysilicon layer 5 and the metal silicide layer 6 are collectively shown as a control gate electrode 14, and illustration of the impurity diffusion layer 7 is omitted.

As illustrated in FIG. 19, the upper edge portion of the control gate electrode 14 has a rounded shape like the first embodiment. The stacked gate structure is surrounded with a silicon oxide film functioning as the sidewall insulating film 8 and the silicon oxide film 30. In an area between neighboring stacked gates, the corner portion of the control gate electrode 14 is filled with the silicon oxide film to at least a height which is between the gate insulating film and the rounded portion. Of course, the structure is the same as the stacked gate included in select transistors ST1 and ST2.

Figure 15:
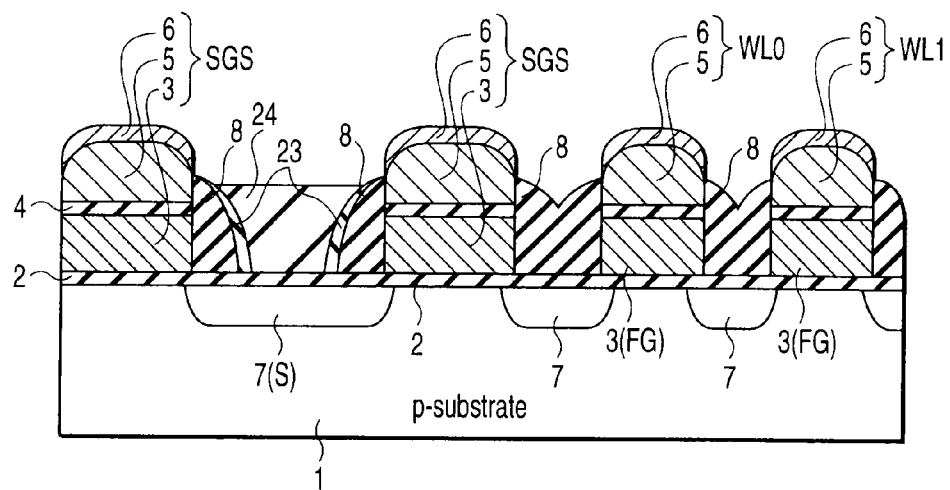

The method of manufacturing the NAND cell according to the second embodiment will be hereinafter described. The structure shown in FIG. 15 is obtained via the process described in the first embodiment. Of course, in the process shown in FIG. 9, the sidewall insulating film 8 is formed using the silicon oxide film. A silicon oxide film 30 is formed on the stacked gate structure and the sidewall insulating film 8 using TEOS, for example. The silicon oxide film 30 is formed to be filled between neighboring stacked gates. The silicon oxide film 30 is formed having a range from 10 nm to 200 nm, for example, a thickness of 50 nm. By doing so, in an area between neighboring stacked gates, the corner portion of the control gate electrode 14 is filled with the silicon oxide film to at least the height which is between the gate insulating film and the rounded portion. The silicon oxide film 30 may be replaced with a material having dielectric constant lower than a silicon nitride film. A silicon nitride film 31 is formed on the silicon oxide film 30 having a range from 10 nm to 200 nm, for example, a thickness of 50 nm. Thereafter, the interlayer insulating film 9 is formed, and then, the process described in the first embodiment is carried out, and thereby, the structure shown in FIG. 18 is obtained.

According to the foregoing structure, the following effect (2) is obtained in addition to the effect (1) described in the first embodiment.

(2) Capacitance coupling between stacked gates is prevented.

According to the structure of the second embodiment, the area between the stacked gates is filled with a silicon oxide film. Therefore, it is possible to reduce the dielectric constant of the area between the stacked gates as compared with the case of using a silicon nitride film. This serves to prevent capacitance coupling between stacked gates, and to improve the read-out margin of a NAND type flash memory. According to the structure of this embodiment, the corner portion of the control gate is rounded. This serves to improve filling characteristic when the area between the stacked gates is filled with the silicon oxide film.

According to this embodiment, a silicon nitride film 31 is formed on the silicon oxide film 30. Thus, it is possible to prevent hydrogen, vapor and alkali ions such as Na and K from being penetrated into the memory cell. This serves to improve the reliability of the memory cell.

As described above, in an area between neighboring stacked gates, the corner portion of the control gate electrode 14 is filled with the silicon oxide film (silicon oxide film 30 and sidewall insulating film 8) to at least the height which is between the gate insulating film and the rounded portion. In general, the silicon oxide film is formed having a wider band gap and less electron trap as compared with the silicon nitride film. Thus, there has been known that a leakage current is made small in an equal electric field. The portion of the smallest interval between the control gate electrodes 14 below the height of the rounded portion is filled with the silicon oxide film. By doing so, it is possible to reduce the leakage current between control gate electrodes 14, and to prevent dielectric breakdown resulting from the leakage current between control gate electrodes. In an area in which the corner portion of the control gate electrode 14 is rounded, the distance between neighboring stacked gates is made wide. Thus, the silicon nitride film 31 may exist in this area. Providing the foregoing structure enables the following advantage to be obtained. Specifically, even if films having relatively bad coverage, for example, TEOS film, BPSG, BSG and NSG films for the interlayer film are used as insulating film 30, the control gate electrode is preferably buried because the upper portion is wide. This serves to solve the problem that a gap is formed between the control gate electrodes, and to improve the dielectric breakdown voltage.

Although the case of the effect between word lines is described, the same effect is obtained between the word line and the select gate line. Specifically, according to the structure of this embodiment, the corner portion of the metal silicide layer 6 functioning as the select gate line is rounded with a radius of curvature of 5 nm or more and 30 nm or less. Therefore, it is possible to prevent a reduction in dielectric breakdown voltage between the neighboring select gate line and word line. However, if the following product is given, there is no need of rounding the select gate line, and the structure of this embodiment is employed in the word line only. The product has the following structure that the interval between the select gate line and the word line is wider than that between word lines, and thus, a reduction in the dielectric breakdown voltage is not caused.

Third Embodiment

Figure 20:
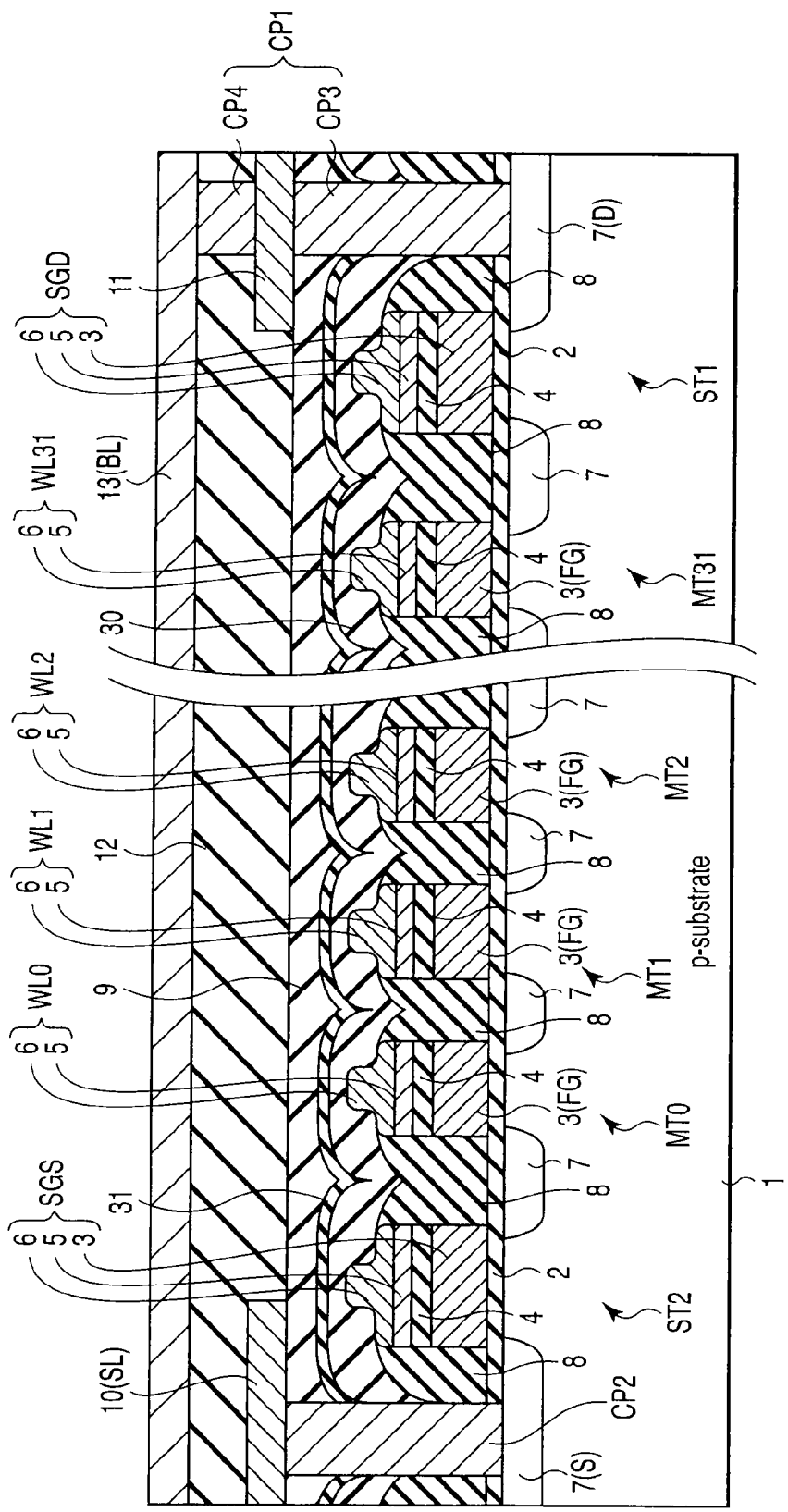
FIG. 20 is a cross-sectional view showing a memory cell array included in a flash memory according to a third embodiment of the invention, and a cross-sectional view taken along the line 3-3 shown in FIG. 2.

A semiconductor memory device according to a third embodiment of the invention and a method of manufacturing the same will be hereinafter described. The third embodiment relates to a shape of the control gate electrode 14 according to the second embodiment. FIG. 20 is a cross-sectional view taken along the bit line direction of a NAND cell according to the third embodiment. FIG. 20 is equivalent to a cross-sectional view in the direction along the line 3-3 of FIG. 2.

As depicted in FIG. 20, in a NAND cell according to the third embodiment, the upper surface of the polysilicon layer 5 and silicide layer 6 functioning as the control gate electrode and part of the gate electrode of select transistors ST1 and ST2 has a convex shaped in the structure described in the second embodiment. The corner portion of the polysilicon layer 5 and the silicide layer 6 has a rounded shape. The structures are the same as described in the second embodiment.

Figure 21:
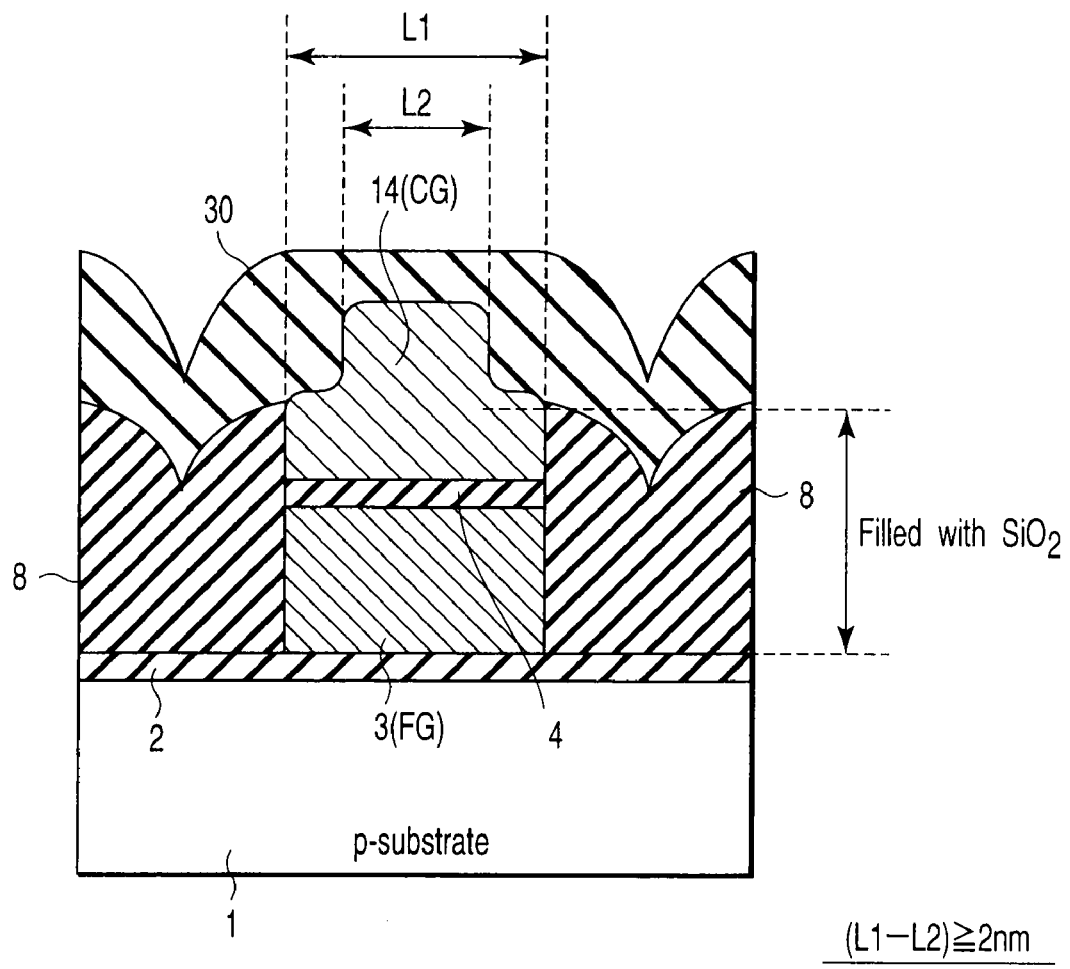
FIG. 21 is an enlarged view showing the sectional structure of a gate electrode included in the memory cell transistor shown in FIG. 20.

FIG. 21 is an enlarged view showing a gate electrode of a memory cell transistor MT shown in FIG. 20. In FIG. 21, the polysilicon layer 5 and the metal silicide layer 6 are collectively shown as a control gate electrode 14, and illustration of an impurity diffusion layer 7 is omitted.

As seen from FIG. 21, the control gate electrode 14 has a convex shape at its upper surface. In other words, the control gate electrode 14 has a step at its side. A gate length under the step (area contacting with inter-gate insulating film 4) is set as L1. A gate length of the upper portion of the step is set as L2 (<L1). The gate length L2 of the upper portion of the step is formed narrower than the gate length L1 of the lower portion of the step at least in a range 2 nm or more and 15 nm or less. The upper edge portion of the control gate electrode 14 and the corner portion of the step are formed into a rounded shape. The radius of curvature R is 5 nm or more and 30 nm or less at least.

In other words, the control gate electrode 14 has an upper area having a first width L2 and a lower area having a second width L1 wider than the first width L2. The upper area is connected to the lower area by an area which has a sidewall with a gradient gentler than a gradient of the sidewall of the upper and lower areas. Although FIG. 21 shows the case of the memory cell transistor MT, each gate electrode of the select transistors ST1 and ST2 is formed having the same structure as above. The width (length extending in the order of source, channel, drain) of the gate electrode of the memory cell transistor MT, that is, the gate length L1 is set at 0.01 μm or more and 0.5 μm or less.

The stacked gate structure is surrounded with a silicon oxide film functioning as a sidewall insulating film 8 and a silicon oxide film 30. In an area between neighboring stacked gates, the upper end face of the lower area having the second width L2 in which the width of the control gate electrode becomes narrow is filled with the silicon oxide film. The foregoing structure is provided, and thereby, the following advantage is obtained. Specifically, the smallest portion of the interval between the control gate electrodes 14 is filled with the silicon oxide film. By doing so, it is possible to reduce the leakage current between control gate electrodes 14, and to prevent dielectric breakdown resulting from the leakage current between control gate electrodes 14. Providing the foregoing convex shape enables the following advantage to be obtained. Specifically, even if films having relatively bad coverage, for example, TEOS film for interlayer film, BPSG, BSG and NSG films are used, the control gate electrode is preferably buried because its upper portion is wide. In this way, it is possible to solve a problem that a void is made between control gate electrodes 14, and to improve the reliability against the dielectric breakdown.

Figure 22:
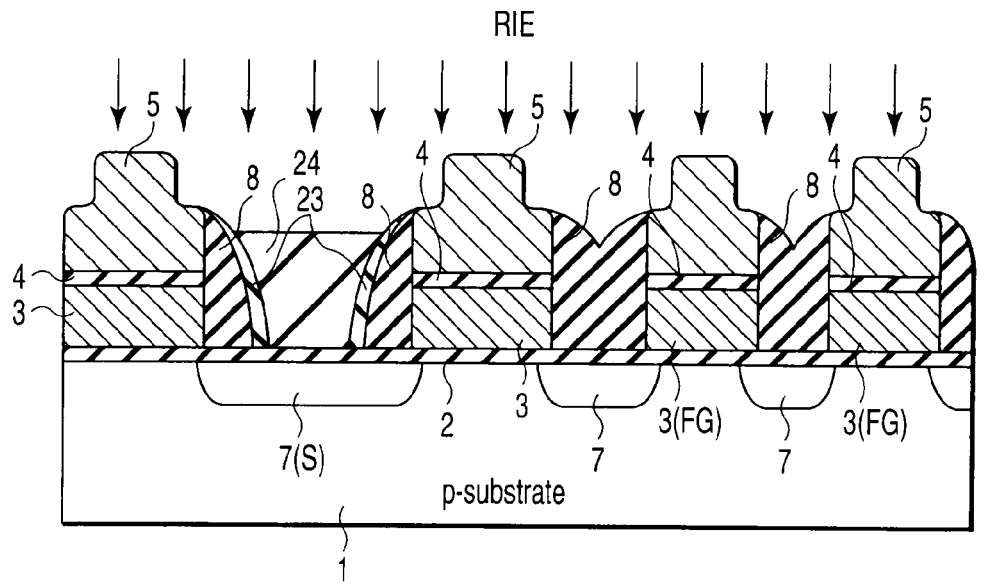
FIG. 22 and FIG. 23 are cross-sectional views showing part of a manufacturing process of a flash memory according to the third embodiment of the invention.
Figure 23:
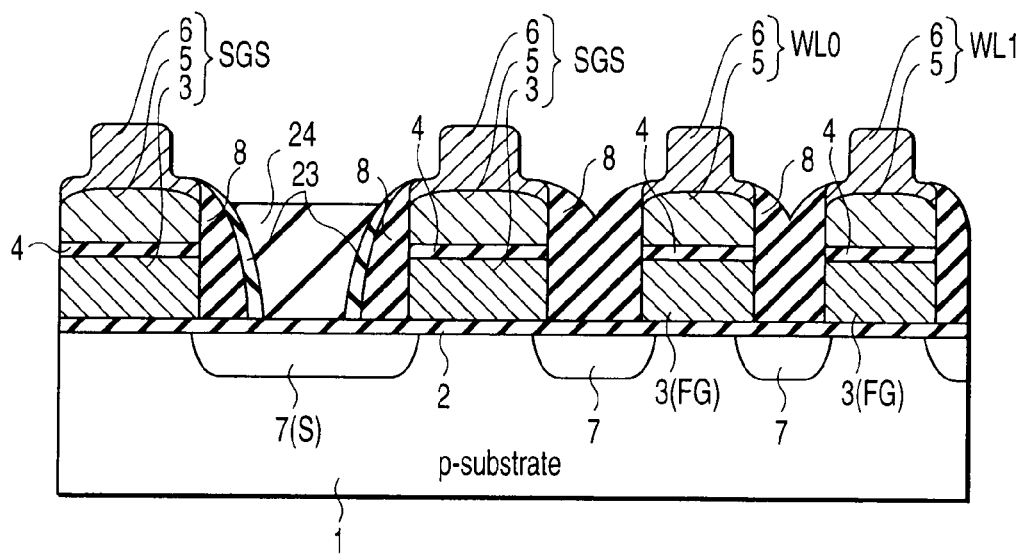

The method of manufacturing the NAND cell according to the third embodiment will be hereinafter described with reference to FIG. 22 and FIG. 23. FIG. 22 and FIG. 23 are cross-sectional views showing a manufacturing process of part of the NAND cell according to the third embodiment.

The structure shown in FIG. 13 is obtained via the process described in the first embodiment. Of course, in the process shown in FIG. 9, a sidewall insulating film 8 is formed using a silicon oxide film. In etching of FIG. 13, the upper surface of the polysilicon layer 5 and part of the side thereof is etched without stopping etching when the mask material 22 is removed. In this case, etching is carried out under the following etching condition. Specifically, the sidewall insulating film 8 is etched about 10 nm deeper than the condition that the mask insulating film 22 only is etched. In the polysilicon layer 5, etching may be carried out under the condition that etching is easy in the horizontal direction. According to another forming method, the surface of the polysilicon layer 5 is removed by about 2 nm to 5 nm as the pre-process of forming a silicide layer having a low resistance and having no defect. A high-resistance high-defect layer formed on the silicon surface may be removed using RIE.

As a result, the polysilicon layer 5 covered with no sidewall insulating film 8 is etched from the sidewall, and thus, the structure shown in FIG. 22 is obtained. Specifically, in the polysilicon layer 5, a step is formed in an upper area from the upper surface of the sidewall insulating film 8; therefore, it is formed into a convex shape. The upper corner portion of the control gate and the step has a rounded shape. The radius of curvature of the rounded shape is set to 5 nm or more, preferably, about 10 nm. Of course, etching of the polysilicon layer 5 may be carried out in the same process of etching the mask material 22 and the insulating film 8. Or, etching may be carried out in an independent process.

Thereafter, a metal silicide layer 6 is formed via the process described in the first embodiment. In this case, the metal silicide layer 6 is formed into a convex shape receiving an influence of the front-end of the metal layer, that is, the shape of the polysilicon layer 5. The corner portion of the metal silicide layer 6 has a rounded shape like the polysilicon layer 5. In this way, the structure shown in FIG. 23 is obtained. According to another method of forming the convex shape, when the metal silicide layer 6 is formed, volume reduction with formation from silicon to silicide film may be used. Moreover, the silicide layer 5 is formed, and thereafter, the silicide layer 6 is etched from the sidewall and the upper surface in a range from 2 nm or more to 15 nm or less using a mixture solution of sulfuric acid and hydrogen peroxide water or choline or alkali solutions to remove the non-reactive metal layer. In this manner, the convex shape may be formed.

Thereafter, a silicon oxide film 30 and a silicon nitride film 31 are formed like the second embodiment. The process described in the first embodiment is therefore used, which obtains the structure shown in FIG. 20.

As seen from the foregoing description, a NAND type flash memory according to the third embodiment can obtain the effects (1) and (2) described in the first and second embodiments. According to the structure of this embodiment, the control gate electrode 14 has a step, and the gate length L2 of the upper portion of the step is smaller than the gate length L1 of the lower portion of the step. Therefore, filling the silicon oxide film 30 is more easily achieved as compared with the first and second embodiments. In the upper portion of the step, the distance between neighboring stacked gates is larger than the lower portion of the step. The silicon nitride film 31 may exist so long as it is positioned higher than the step. In particular, if capacitance coupling and penetration of hydrogen, vapor and alkali ions such as Na and K to the memory cell are no problem, there is no need of forming the silicon oxide and nitride films 30 and 31 like the first embodiment.

Although the case of the effect between word lines is described, the same effect is obtained between the word line and the select gate line. Specifically, according to the structure of this embodiment, the corner portion of the metal silicide layer 6 functioning as the select gate line is rounded with a radius of curvature of 5 nm or more and 30 nm or less. Therefore, it is possible to prevent a reduction in dielectric breakdown voltage between the neighboring select gate line and word line. However, if the following product is given, there is no need of rounding the select gate line, and the structure of this embodiment is employed in the word line only. The product has the following structure that the interval between the select gate line and the word line is wider than that between word lines, and thus, a reduction in the dielectric breakdown voltage is not caused.

Fourth Embodiment

Figure 24:
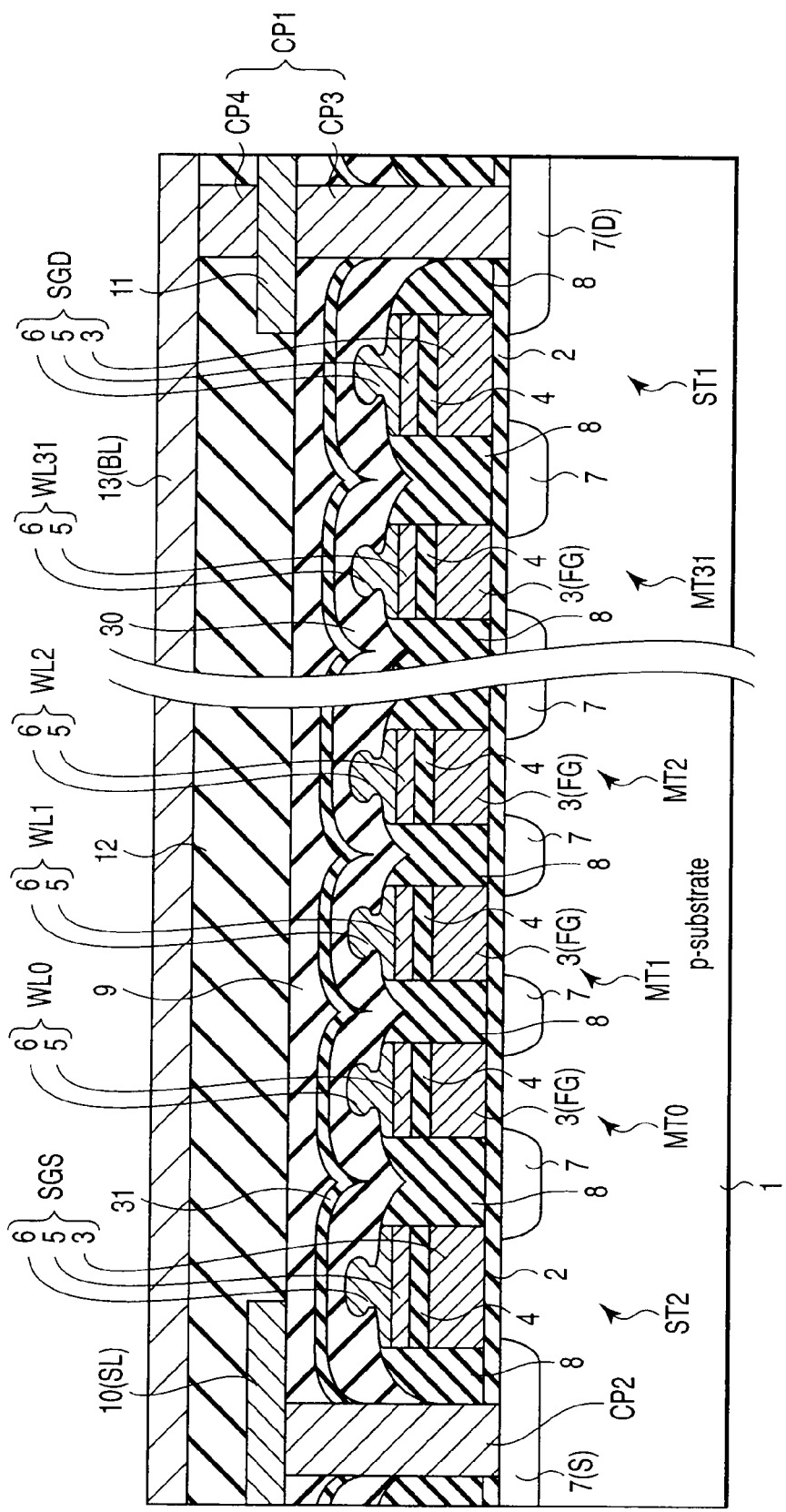
FIG. 24 is a cross-sectional view showing a memory cell array included in a flash memory according to a fourth embodiment of the invention, and a cross-sectional view taken along the line 3-3 shown in FIG. 2.

A semiconductor memory device according to a fourth embodiment of the invention and a method of manufacturing the same will be hereinafter described. This fourth embodiment relates to a shape of the control gate electrode 14 in the second embodiment, and to a shape different from the third embodiment. FIG. 24 is a cross-sectional view taken along the bit line direction of a NAND cell according to the fourth embodiment. FIG. 24 is equivalent to a cross-sectional view in the direction along the line 3-3 of FIG. 2.

As shown in FIG. 24, in a NAND cell according to the fourth embodiment, a step of the polysilicon layer 5 and the silicide layer 6 functioning as the control gate electrode and part of gate electrode of select transistors ST1 and ST2 has a dented shape. The corner portion of the upper surface of the polysilicon layer 5 and silicide layer 6 and the corner portion of the step have a rounded shape. The other structures are the same as described in the second embodiment.

Figure 25:
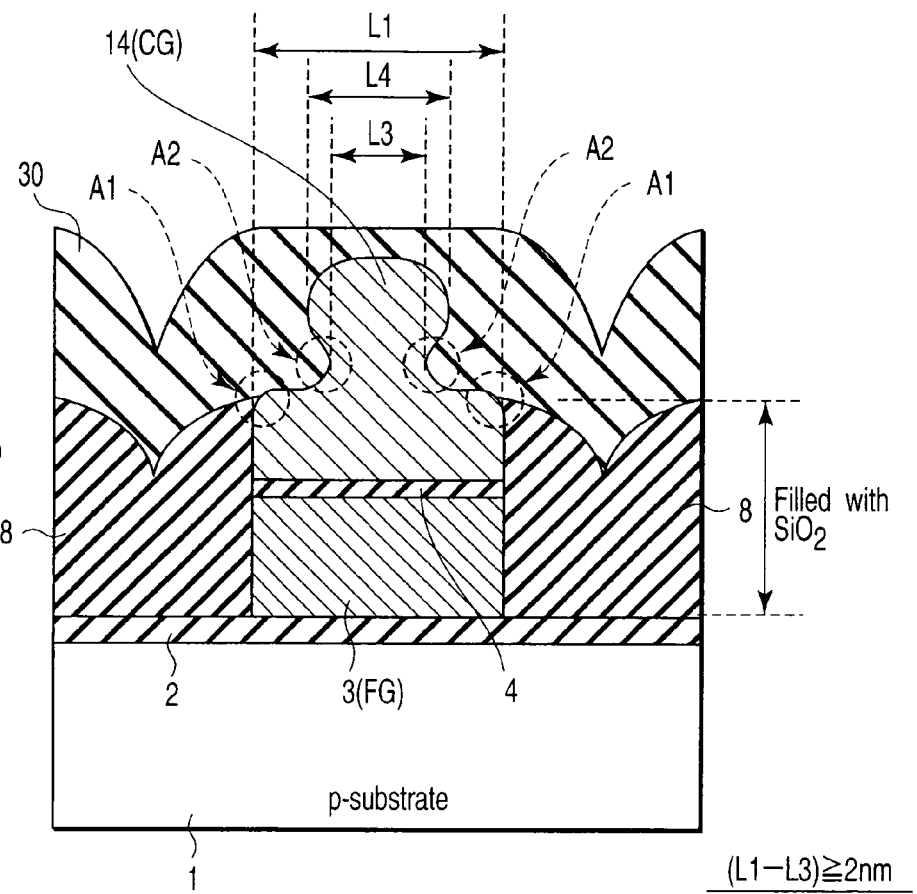
FIG. 25 is an enlarged view showing the sectional structure of a gate electrode included in the memory cell transistor shown in FIG. 24.

FIG. 25 is an enlarged view showing a gate electrode of a memory cell transistor MT shown in FIG. 24. In FIG. 25, the polysilicon layer 5 and the metal silicide layer 6 are collectively shown as a control gate electrode 14, and illustration of the impurity diffusion layer 7 is omitted.

As illustrated in FIG. 25, the control gate electrode 14 has a convex shape at its upper surface. Specifically, the control gate electrode 14 has a step at its side. The gate length is different between the upper and lower (an area contacting with inter-gate insulating film 4) portion. In FIG. 25, in the corner portions A1 and A2 of the step, a corner portion is formed into a dented shape. Thus, the gate length of the lower portion of the step is set as L1, the gate length of the dented portion is set as L3, and the gate length of the upper portion of the step is set as L4. By doing so, the following relation of L1>L4>L3 is given. The gate length L3 of the dented portion is set narrower than the gate length L1 in a range from 2 nm or more and 15 nm or less. Moreover, the gate length L4 is set narrower than the gate length L1 in a range from 2 nm or more and 10 nm or less. The corner portions A1, A2 of the step and the upper corner portion of the control gate have a rounded shape. The radius of curvature R is more than 5 nm and 30 nm or less. Although FIG. 21 shows the case of the memory cell transistor MT, each gate electrode of select transistors ST1 and ST2 may be formed having the same structure as above. The width (length extending in the order of source, channel and drain) of the memory cell transistor MT, that is, the gate length L1 is set to be 0.01 μm or more and 0.5 μl or less.

The stacked gate structure is surrounded with a silicon oxide film functioning as the sidewall insulating film 8 and a silicon oxide film 30. In an area between neighboring stacked gates, the following area may be filled with the silicon oxide film. That is, the area is filled with the silicon oxide film by the height which is between the gate insulating film 14 and the corner portion A1 of the step of the control gate electrode 14; in other words, a region in which the width of the control gate electrode becomes narrow. According to the foregoing structure, the smallest gap between the control gate electrodes is filled with the silicon oxide film. This serves to reduce the leakage current between control gate electrodes, and to prevent dielectric breakdown resulting from the leakage current between control gate electrodes.

Figure 26:
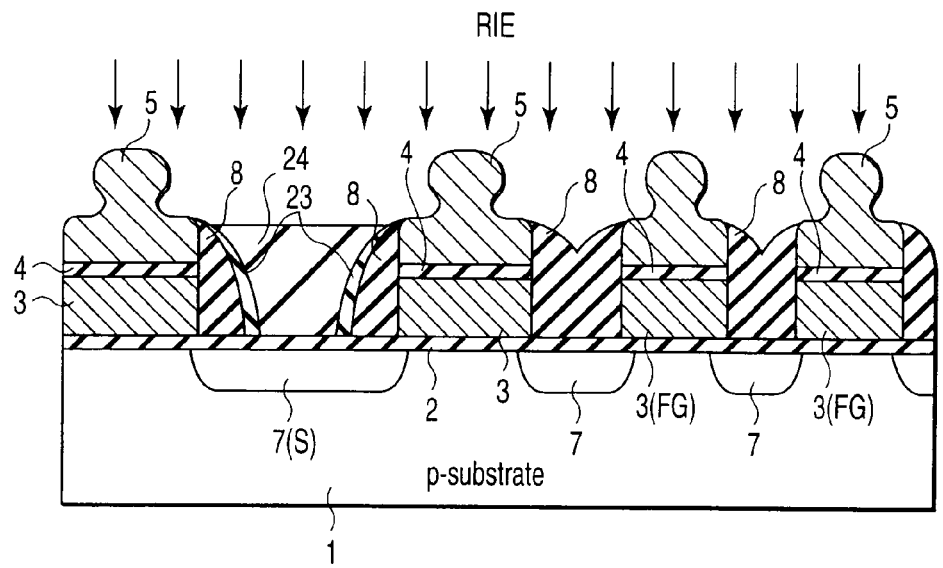
FIG. 26 is a cross-sectional view showing part of a manufacturing process of a flash memory according to the fourth embodiment of the invention.
Figure 27:
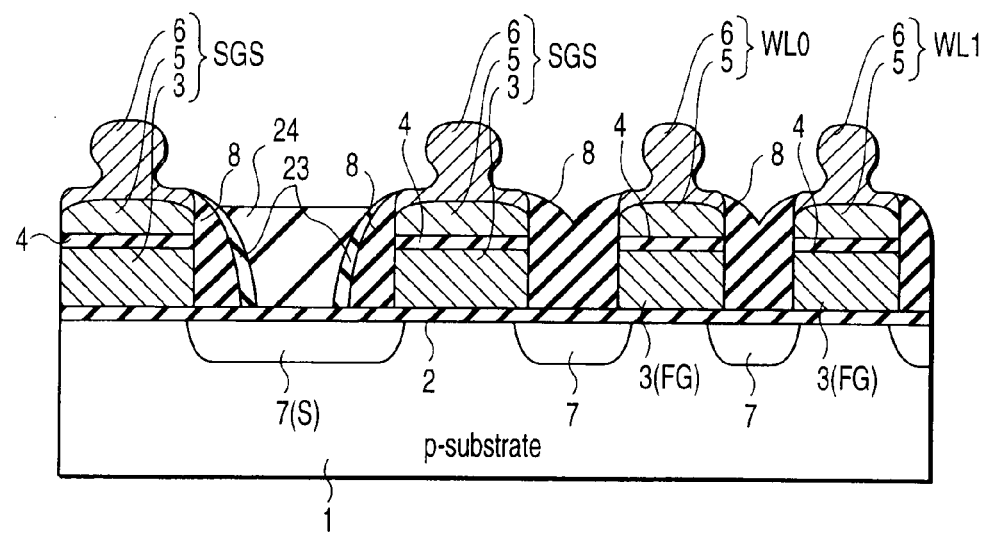
FIG. 27 is a cross-sectional view showing part of a manufacturing process of a flash memory according to the fourth embodiment of the invention.

The method of manufacturing a NAND cell according to the fourth embodiment will be hereinafter described with reference to FIG. 26 and FIG. 27. FIG. 26 and FIG. 27 are cross-sectionals view showing a manufacturing process of part of the NAND cell according to this embodiment. The structure shown in FIG. 13 is obtained via the process described in the first embodiment. Of course, in the process shown in FIG. 9, the sidewall insulating film 8 is formed using a silicon oxide film as a material. In the etching shown FIG. 13, the upper surface of the polysilicon layer 5 and part of the side thereof are etched without stopping etching when the mask material 22 is removed. In this case, etching is carried out under the following etching condition. Specifically, the sidewall insulating film 8 is etched by about 10 nm more as compared with the condition that the mask material 22 only is etched. The foregoing etching is carried out so that the polysilicon 5 is etched in the horizontal direction, and thereby, the dented shape is obtained. The dented shape is formed in the following manner. For example, strong anisotropic reactive ion etching hard to remove the sidewall is carried out by the upper portion of the dented portion. Thereafter, reactive ion etching is changed over from the lower portion of the dented portion under the following condition. According to the condition, a weak anisotropic etching which has a high selectivity to the insulating film 4 and can readily remove the side wall of the layer 5 is carried out to reduce damage to the insulating film 4.

As a result, as seen from FIG. 26, the polysilicon layer 5 having the rounded corner portion, and the dented side is obtained. Of course, etching of the polysilicon layer 5 may be carried out in the same process of etching the mask material 22 and the insulating film 8. Or, etching may be carried out in an independent process.

Via the process described in the first embodiment, a metal silicide layer 5 is formed. In this case, the side of the metal silicide layer 6 is formed into a dented shape receiving an influence of the shape of the polysilicon layer 5, which is a front-end of the metal layer. Thus, the metal silicide layer 6 has a rounded shape like the polysilicon layer 5. In this way, the structure shown in FIG. 27 is obtained.

Thereafter, a silicon oxide film 30 and a silicon nitride film 31 are formed like the second embodiment. And then, the process described in the first embodiment is carried out, and thereby, the structure shown in FIG. 24 is obtained.

In a NAND type flash memory according to the fourth embodiment, the foregoing effects (1) and (2) described in the first and second embodiments are obtained. In this embodiment, it is possible to improve characteristic of filling the silicon oxide film 30, like the third embodiment. In addition, the silicon nitride film 31 may be formed at a position higher than the step. In particular, if capacitance coupling and mixture of hydrogen, vapor and alkali ions such as Na and K to the memory cell are not a problem, the silicon oxide film 30 and the silicon nitride film 31 need not be formed like the first embodiment.

In the EEPROM according to the first to fourth embodiments of the present invention, the corner portion of the control gate electrode has a rounded shape. Therefore, it is possible to prevent field concentration at the corner portion of the control gate electrode, and improve the reliability of the EEPROM. In other words, in the first and second embodiments, the upper corner portion of the control gate electrode 14 is rounded, as shown in FIG. 4.

Figure 28:
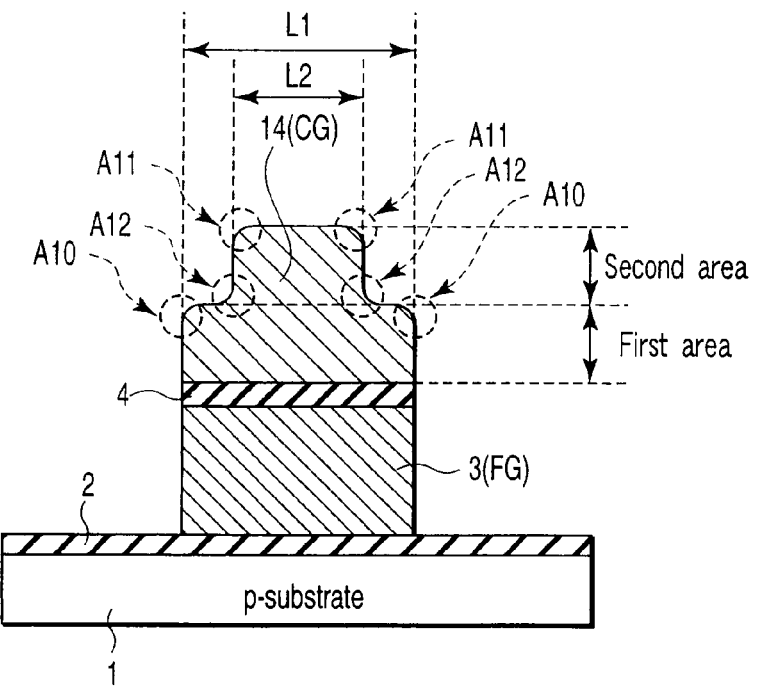
FIG. 28 is an enlarged view showing the sectional structure of a gate electrode of the memory cell transistor included in the flash memory according to the third embodiment of the invention.

According to the third embodiment, as depicted in FIG. 21, the upper surface of the control gate is formed into a convex shape. The corner portion of the convex shape and the corner portion of the step formed by the convex shape are formed into a rounded shape. The structure according to the third embodiment will be described with reference to FIG. 28. FIG. 28 is a cross-sectional view showing a stacked gate structure according to the third embodiment. As illustrated in FIG. 28, a control gate electrode 14 has two areas, that is, first and second areas. Of two areas, the second area is equivalent to the foregoing convex portion. Therefore, a width L2 of the second area is set smaller than a width L1 of the first area. According to such a structure, an upper corner portion A10 of the first area, an upper corner portion A11 of the second area and an area A12 contacting the first and second areas are formed into a rounded shape. These areas A10 to A12 have the radius of curvature of 5 nm or more and 30 nm or less. The following description is given with reference to FIG. 28. In this case, the second area does not include the corner portion A12. Specifically, the first and second area are connected via an area (area A12) having the gradient larger than the sidewall of the first and second area. The upper corner portions of the first and second areas are rounded.

Figure 29:
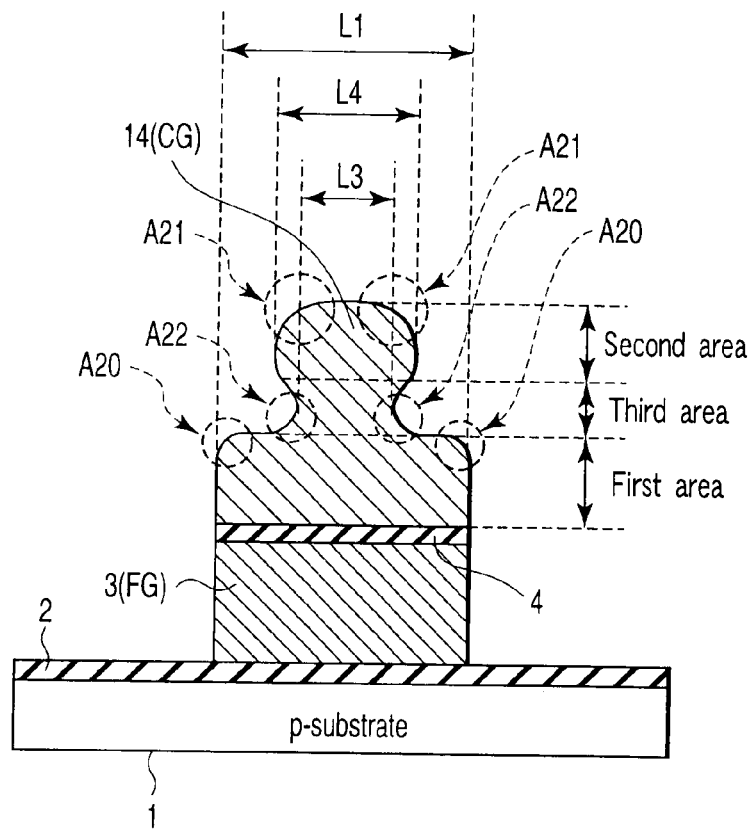
FIG. 29 is an enlarged view showing the sectional structure of a gate electrode of the memory cell transistor included in the flash memory according to the fourth embodiment of the invention.

According to the fourth embodiment, the side of the control gate is formed into a dented shape. The corner portion of the dented shape is rounded. The structure according to the fourth embodiment is next described with reference to FIG. 29. FIG. 29 is a cross-sectional view showing a stacked gate structure according to the fourth embodiment. As seen from FIG. 29, a control gate electrode 14 has three areas, that is, first to third areas. Of these three areas, the third area is equivalent to the dented area. Therefore, a width L1 of the first area is larger in a range from 2 nm or more and 15 nm or less than a width L4 of the second area, and a width L4 of the second area is larger than a width L3 of the third area. In other words, the control gate electrode 14 has a dented shape connected via the following areas.

One is an upper area (second area) having a first width L4, and another is a lower area (first area) having a second width L1 wider than the first width L4. Further, another is an area (third area) having a width L3 narrower than the first width L4 and connecting the upper area (the second area) and the lower area (the first area). The gate length L4 is set narrower than the gate length L1 in a range from 2 nm or more and 10 nm or less. According to the structure, an upper corner portion A20 of the first area and an upper corner portion A21 of the second area are formed into a rounded shape. The radius of curvature is set to at least 5 nm or more and 30 nm or less. Moreover, each corner portion of an area contacting the first area with the third area and an area contacting the second area with the third area is rounded. As a result, according to the structure shown in FIG. 29, an area A22 of the entire side of the third area is formed into a curved shape. The radius of curvature of the area A22 is set to at least 5 nm or more and 30 nm or less. Of course, the side of the third area does not need to be curved in the entire area. The curved shape may be merely given in the corner portion contacting the first area with the second area.

Although the case of the effect between word lines is described, the same effect is obtained between the word line and the select gate line. Specifically, according to the structure of this embodiment, the corner portion of the metal silicide layer 6 functioning as the select gate line is rounded with a radius of curvature of 5 nm or more and 30 nm or less. Therefore, it is possible to prevent a reduction in dielectric breakdown voltage between the neighboring select gate line and word line. However, if the following product is given, there is no need of rounding the select gate line, and the structure of this embodiment is employed in the word line only. The product has the following structure that the interval between the select gate line and the word line is wider than that between word lines, and thus, a reduction in the dielectric breakdown voltage is not caused.

Figure 30:
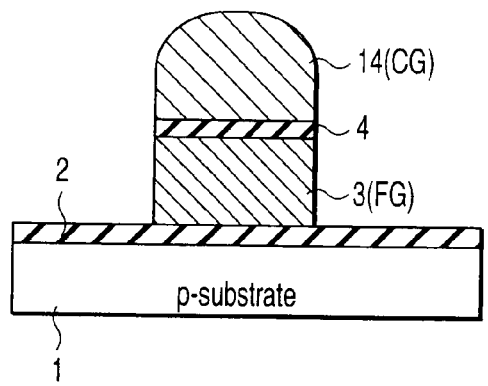
FIG. 30 is an enlarged view showing the sectional structure of a gate electrode of a memory cell transistor according to a modification example of the first and second embodiments of the invention.

The entire control gate electrode may be rounded, and not the corner portion only. The structure is shown in FIG. 30. FIG. 30 is a cross-sectional view showing a memory cell transistor MT. As depicted in FIG. 30, the entire upper surface of a control gate electrode 14 may be formed into a curved shape.

The foregoing embodiments have described a NAND type flash memory as an example. For example, the above embodiments are applicable to a NOR type flash memory and a 3Tr-NAND type flash memory having one memory cell transistor in the structure of the NAND type flash memory. The above embodiments are applicable to a 2Tr-NAND type flash memory eliminating a drain-side select transistor ST1 in the structure of the 3-Tr NAND type flash memory. Therefore, the present embodiments are widely applicable to non-volatile semiconductor memories that include a stacked gate structure.

The foregoing embodiments have described a NAND type memory cell using the polysilicon film 3 as a floating gate. Of course, for example, it is evident that the above embodiments are applicable to a so-called MONOS structure NAND type memory, or a so-called MANOS (Metal-AlOx-SiN—SiO$_2$-Silicon) structure NAND type memory using a silicon nitride film, silicon oxynitride film (silicon oxide and nitride film), HfSiO film, HfAlO film, AlOx film, HfO film, TiO film TaO film or these stacked structures as a charge storage layer. The metal silicide layer 6 may be formed up to the depth contacting the insulating film 4.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   a source region and a drain region formed separated from each other in a surface of a semiconductor substrate;
   a channel region formed in the semiconductor substrate and located between the source region and the drain region;
   a charge storage layer formed on the channel region with a first insulating film interposed therebetween; and
   a control gate electrode formed on the charge storage layer with a second insulating film interposed therebetween, and having a convex shape at its upper surface,
   the control gate electrode including an upper area having a first width, and a lower area having a second width wider than the first width, and having a gentler gradient as compared with a gradient of a side face of the upper and lower areas, the gentler gradient being located in part of the upper area which is continuous with the lower area, and having a width that increases from the first width of the upper area to the second width of the lower area, and
   a corner portion of the convex shape of a control gate having a rounded shape.

2. The device according to claim 1, further comprising
   a plurality of memory cell transistors including current paths and stacked gates, each of the stacked gates including the charge storage layer and the control gate electrode, the current paths of the memory cell transistors being mutually connected in series;
   a first select transistor having a first current path connected in series to one of the current paths of the memory cell transistors positioned at one end side of the serial connection; and
   a second select transistor having a second current path connected in series to one of the current paths of the memory cell transistors positioned at the other end side of the serial connection,
   the first and second select transistors each including a gate electrode having a rounded shape with a radius of curvature of 5 nm or more and 30 nm or less at its upper corner portion.

3. The device according to claim 2, further comprising:
   a third insulating film formed on the semiconductor substrate and located between neighboring stacked gates, between one of the stacked gates and the gate electrode of the first select transistor which are adjacent to each other, and between one of the stacked gates and the gate electrode of the second select transistor which are adjacent to each other, the third insulating film being formed of a silicon oxide film by a height between a surface of the first insulating film and the gentler gradient.

4. The device according to claim 1, wherein the control gate electrode includes:
- a semiconductor layer formed on the second insulating film; and
- a metal silicide layer formed on the semiconductor layer, and having the rounded shape at the corner portion of the convex shape of the control gate electrode,
- the metal silicide layer is formed using any of a titanium silicide film, a cobalt silicide film, a nickel silicide film and a metal silicide film containing two or more of titanium, nickel and cobalt.

5. The device according to claim 1, wherein the radius of curvature of the rounded shape of the control gate electrode is set to 5 nm or more and 30 nm or less.

6. The device according to claim 1, wherein a width of the upper area is smaller than that of the lower area in a range from 2 nm or more and 15 nm or less.

7. The device according to claim 1, wherein the control gate electrode is formed in a convex shape, the upper area of the control gate electrode is provided as a relatively narrow portion, and the lower area of the control gate electrode is provided as a base relatively wide portion.

8. The device according to claim 1, wherein the control gate electrode includes:
- a semiconductor layer formed on the second insulating film; and
- a metal silicide layer formed on the semiconductor layer, and having the rounded shape at the corner portion of the convex shape of the control gate,
- wherein the metal silicide layer is formed using a cobalt silicide film, and
- the cobalt silicide film is formed at the upper area and at the lower area.

* * * * *